US010554010B2

(12) United States Patent
Tsuji

(10) Patent No.: US 10,554,010 B2
(45) Date of Patent: Feb. 4, 2020

(54) METHOD OF PRODUCING SEMICONDUCTOR LASER DEVICE AND METHOD OF PRODUCING OPTICAL DIRECTIONAL COUPLER

(71) Applicant: SUMITOMO ELECTRIC INDUSTRIES, LTD., Osaka (JP)

(72) Inventor: Yukihiro Tsuji, Tama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/934,004

(22) Filed: Mar. 23, 2018

(65) Prior Publication Data
US 2018/0331491 A1  Nov. 15, 2018

(30) Foreign Application Priority Data

May 11, 2017 (JP) ................................ 2017-094737
Aug. 4, 2017 (JP) ................................ 2017-151537

(51) Int. Cl.
*H01S 5/00* (2006.01)
*H01S 5/183* (2006.01)
*H01S 5/40* (2006.01)

(52) U.S. Cl.
CPC ............ *H01S 5/0042* (2013.01); *H01S 5/183* (2013.01); *H01S 5/4068* (2013.01); *H01S 2304/02* (2013.01); *H01S 2304/04* (2013.01)

(58) Field of Classification Search
None
See application file for complete search history.

(56) References Cited

U.S. PATENT DOCUMENTS

| 2010/0103972 | A1* | 4/2010 | Saito | B82Y 20/00 372/50.1 |
| 2011/0158275 | A1* | 6/2011 | Yoshizumi | H01S 5/3202 372/44.011 |
| 2012/0305933 | A1* | 12/2012 | Nakahata | H01L 33/16 257/76 |
| 2013/0183813 | A1* | 7/2013 | Masuyama | H01L 21/02617 438/478 |

OTHER PUBLICATIONS

M. W. DeVre et al., "Characterization of GaAs/AlGaAs non-selective ICP etch process for VCSELs applications," Plasma-Therm, Technical Papers, Retrieved from http://www.plasma-therm.com/technical-papers.html.

* cited by examiner

*Primary Examiner* — Bo B Jang
(74) *Attorney, Agent, or Firm* — Smith, Gambrell & Russell, LLP.

(57) ABSTRACT

A method of producing a semiconductor laser device includes the steps of preparing first and second substrate products each of which includes a substrate and a stacked semiconductor layer formed on the substrate, the first and second substrate products being different from each other; etching the first substrate product with a chlorine-based gas in a vacuum chamber by using a dry etching method; evacuating the vacuum chamber while monitoring the pressure of hydrogen chloride in the vacuum chamber so as to obtain a partial pressure of the hydrogen chloride within a predetermined range; after evacuating the vacuum chamber, introducing the second substrate product into the vacuum chamber while maintaining a vacuum state inside the vacuum chamber; and etching the second substrate product with a chlorine-based gas in the vacuum chamber by using the dry etching method.

7 Claims, 16 Drawing Sheets

METHOD OF PRODUCING SEMICONDUCTOR LASER DEVICE AND METHOD OF PRODUCING OPTICAL DIRECTIONAL COUPLER

BACKGROUND OF THE INVENTION

1. Field of the Invention

The present invention relates to a method of producing a semiconductor laser device and a method of producing an optical directional coupler.

2. Description of the Related Art

For example, Non-Patent Document 1 (M. W. DeVre et al., "Characterization of GaAs/AlGaAs non-selective ICP etch process for VCSELs applications," Plasma-Therm, Technical Papers) describes a vertical cavity surface-emitting laser (VCSEL), which is one of semiconductor laser devices. Non-Patent Document 1 describes a method for etching a stacked semiconductor layer including an active layer using a photoresist and a chlorine-based gas.

SUMMARY OF THE INVENTION

In the VCSEL, an electrode is formed on a surface exposed by etching. The characteristics of the VCSEL tend to vary depending on the position of the electrode in the direction of the thickness of the stacked semiconductor layer of the VCSEL. To reduce variations in the characteristics of the VCSEL, uniformity in etch depth is required. However, when a chlorine-based gas is used for the etching, the etching rate tends to change greatly even under predetermined optimum etching conditions. Therefore, variations occur in the positions of the electrodes of VCSELs disposed on different wafers, causing variations in the characteristics of the VCSELs.

In an optical directional coupler, ridges are formed by etching. The characteristics of the optical directional coupler also tend to vary depending on the height of the ridges. To reduce variations in the characteristics of the optical directional coupler, uniformity in etch depth is also required. However, when a chlorine-based gas is used for the etching, the etching rate tends to change greatly even under predetermined optimum etching conditions as described above. Therefore, variations occur in the ridge heights of optical directional couplers disposed on different wafers, causing variations in the characteristics of the optical directional couplers in the similar manner as the VCSELs.

The change in the etching rate may be caused by chlorides which are reaction products of the chlorine-based gas and elements contained in the stacked semiconductor layer included in the VCSELs and the optical directional couplers. To maintain the uniformity in the etching rate, maintenance of the process chamber used for the etching is performed frequently. Generally, in the maintenance, the interior of the process chamber is first cleaned. Specifically, since the chlorides are water-soluble, the process chamber is open to the atmosphere, and the interior of the process chamber is wiped with a damp cloth. After the cleaning, water in the process chamber is removed. The maintenance described above is time consuming, and therefore the efficiency of production of the VCSELs and the optical directional couplers is low.

A method of producing a semiconductor laser device according to one aspect of the present invention includes a step of preparing first and second substrate products each of which includes a substrate having a principal surface and a stacked semiconductor layer formed on the principal surface of the substrate, the first and second substrate products being different from each other, the stacked semiconductor layer including a contact layer, an n-type semiconductor layer formed on the contact layer, an active layer formed on the n-type semiconductor layer, and a p-type semiconductor layer formed on the active layer; a first step of etching the first substrate product with a chlorine-based gas in a vacuum chamber by using a dry etching method; a second step of evacuating the vacuum chamber while monitoring a partial pressure of hydrogen chloride in the vacuum chamber so as to obtain the partial pressure of the hydrogen chloride within a predetermined range; a third step of introducing the second substrate product into the vacuum chamber while maintaining a vacuum state inside the vacuum chamber; and a fourth step of etching the second substrate product with a chlorine-based gas in the vacuum chamber by using a dry etching method.

A method of producing an optical directional coupler according to another aspect of the present invention includes a step of preparing first and second substrate products each of which includes a substrate having a principal surface and a stacked semiconductor layer formed on the principal surface of the substrate, the first and second substrate products being different from each other, the stacked semiconductor layer including a first cladding layer, a core layer formed on the first cladding layer, and a second cladding layer formed on the core layer; a first step of etching the first substrate product with a chlorine-based gas in a vacuum chamber by using a dry etching method so as to form a ridge in the second cladding layer; a second step of evacuating the vacuum chamber while monitoring a partial pressure of hydrogen chloride in the vacuum chamber so as to obtain the partial pressure of the hydrogen chloride within a predetermined range; a third step of introducing the second substrate product into the vacuum chamber while maintaining a vacuum state inside the vacuum chamber; and a fourth step of etching the second substrate product with a chlorine-based gas in the vacuum chamber by using a dry etching method.

The above and other objects, features, and advantages of the present invention will be readily apparent from the following detailed description of preferred embodiments of the invention with reference to the accompanying drawings.

DESCRIPTION OF THE PREFERRED EMBODIMENTS

Figure 1:
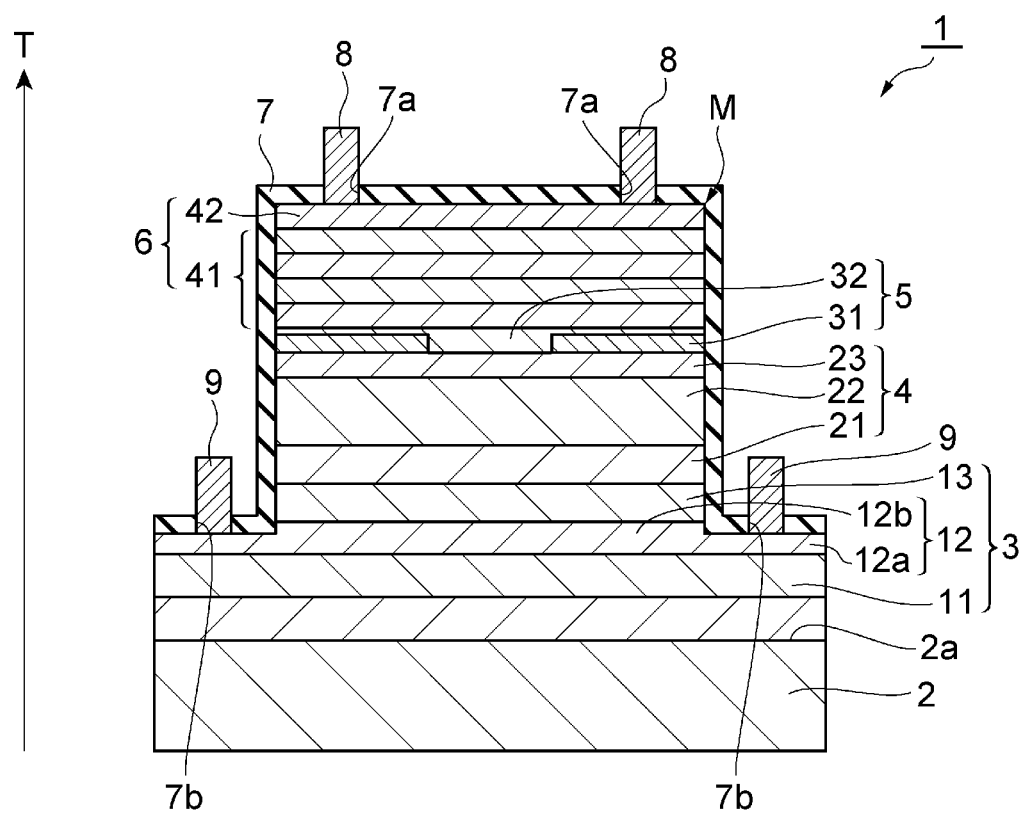
FIG. 1 is a cross-sectional view showing a semiconductor laser device according to an embodiment.

Specific embodiments will be described below.

A method of producing a semiconductor laser device according to an embodiment includes (a) a step of preparing first and second substrate products each of which includes a substrate having a principal surface and a stacked semiconductor layer formed on the principal surface of the substrate, the first and second substrate products being different from each other, the stacked semiconductor layer including a contact layer, an n-type semiconductor layer formed on the contact layer, an active layer formed on the n-type semiconductor layer, and a p-type semiconductor layer formed on the active layer; (b) a first step of etching the first substrate product with a chlorine-based gas in a vacuum chamber by using a dry etching method; (c) a second step of evacuating the vacuum chamber while monitoring a partial pressure of hydrogen chloride in the vacuum chamber so as to obtain the partial pressure of the hydrogen chloride within a predetermined range; (d) a third step of introducing the second substrate product into the vacuum chamber while maintaining a vacuum state inside the vacuum chamber; and (e) a fourth step of etching the second substrate product with a chlorine-based gas in the vacuum chamber by using a dry etching method.

A method of producing an optical directional coupler according to another embodiment includes (a) a step of preparing first and second substrate products each of which includes a substrate having a principal surface and a stacked semiconductor layer formed on the principal surface of the substrate, the first and second substrate products being different from each other, the stacked semiconductor layer including a first cladding layer, a core layer formed on the first cladding layer, and a second cladding layer formed on the core layer; (b) a first step of etching the first substrate product with a chlorine-based gas in a vacuum chamber by using a dry etching method so as to form a ridge in the second cladding layer; (c) a second step of evacuating the vacuum chamber while monitoring a partial pressure of hydrogen chloride in the vacuum chamber so as to obtain the partial pressure of the hydrogen chloride within a predetermined range; (d) a third step of introducing the second substrate product into the vacuum chamber while maintaining a vacuum state inside the vacuum chamber; and (e) a fourth step of etching the second substrate product with a chlorine-based gas in the vacuum chamber by using a dry etching method.

According to the methods of producing the semiconductor laser device and producing the optical directional coupler, in the first step, the first substrate product is dry-etched with the chlorine-based gas in the vacuum chamber. In the first step, the chlorine-based gas reacts with elements contained in the stacked semiconductor layer of the first substrate product, and chlorides are thereby generated. When the chlorides react with water in the vacuum chamber, hydrogen chloride serving as an etching gas is generated. Each of the production methods includes the second and third steps described above. This allows the partial pressure of the hydrogen chloride during the dry etching performed in the fourth step to be set within the predetermined range. Therefore, when the second substrate product in the vacuum chamber is etched, the change in the etching rate due to the hydrogen chloride may be well reduced. In this case, even though maintenance including exposure of the vacuum chamber to the atmosphere, wiping with a damp cloth, etc. is not performed frequently, the etching rate of the stacked semiconductor layer in the second substrate product is unlikely to change. As a result, variations in the lasing characteristics of the semiconductor laser device may be reduced. Similarly, variations in the optical characteristics of the optical directional coupler may be reduced. In addition, by using the above production methods, the frequency of the maintenance may be reduced, and the efficiencies of production of the semiconductor laser device and production of the optical directional coupler can be improved.

In the method of producing the semiconductor laser device according to an embodiment, preferably, in the first step, the first substrate product is etched until the contact layer is exposed so as to form a semiconductor mesa on the substrate.

In the method of producing the optical directional coupler according to an embodiment, preferably, in the first step, the first substrate product is etched so as to form a ridge in the second cladding layer.

In the methods of producing the semiconductor laser device and producing the optical directional coupler according to an embodiment, preferably, in the second step, the vacuum chamber is evacuated until the partial pressure of the hydrogen chloride falls within the range between $2 \times 10^{-5}$ Pa and $5 \times 10^{-5}$ Pa. In this case, variations in the etching rate of the stacked semiconductor layer in the second substrate product due to the hydrogen chloride may be well reduced.

In the methods of producing the semiconductor laser device and producing the optical directional coupler according to an embodiment, preferably, the second step includes a step of generating an oxygen plasma in the vacuum chamber. In this case, the chlorides are oxidized. Therefore, hydrogen chloride, which is a reaction product of water and a chloride, is less likely to be generated.

In the methods of producing the semiconductor laser device and producing the optical directional coupler according to an embodiment, preferably, the second step includes a step of heating the interior of the vacuum chamber. In this case, water in the vacuum chamber may be easily removed. Therefore, hydrogen chloride, which is a reaction product of water and a chloride, is less likely to be generated.

In the methods of producing the semiconductor laser device and producing the optical directional coupler according to an embodiment, preferably, each of the first and fourth steps includes a step of forming a mask having at least one of hydrophobicity and water impermeability on the stacked semiconductor layer. In the first step, the first substrate product is etched through the mask formed on the stacked semiconductor layer of the first substrate product. In addition, in the fourth step, the second substrate product is etched through the mask formed on the stacked semiconductor layer of the second substrate product. In this case, water is less likely to adhere to the masks formed on the stacked semiconductor layers in the first and second substrate products. Therefore, the amount of water diffusing inside the vacuum chamber due to the masks can be reduced.

In the methods of producing the semiconductor laser device and producing the optical directional coupler according to an embodiment, preferably, in the second step, the partial pressure of hydrogen chloride in the vacuum chamber is monitored by using a mass spectrometer.

Details of Embodiments of the Present Invention

Preferred embodiments of the present invention will be described in detail with reference to the accompanying drawings. In the following description, the same components or components having the same functions are denoted by the same numerals, and redundant description will be omitted.

FIG. 1 is a cross-sectional view showing a semiconductor laser device according to one embodiment. As shown in FIG. 1, the semiconductor laser device 1 is a vertical cavity surface-emitting laser (VCSEL). The semiconductor laser device 1 includes a substrate 2, a first semiconductor layer stack 3, an active layer 4, a current confinement layer 5, a second semiconductor layer stack 6, an insulating layer 7, and electrodes 8 and 9. The first semiconductor layer stack 3, the active layer 4, the current confinement layer 5, and the second semiconductor layer stack 6 are stacked in this order on a principal surface 2a of the substrate 2. In the semiconductor laser device 1, part of the first semiconductor layer stack 3, the active layer 4, the current confinement layer 5, and the second semiconductor layer stack 6 form a semiconductor mesa M. In the following description, the thickness direction of the semiconductor layers forming the semiconductor laser device 1 is defined as direction T.

The substrate 2 is a III-V group semiconductor substrate and is, for example, an i-type or n-type GaAs substrate. When the substrate 2 is n-type conductive, the substrate 2 contains an n-type dopant such as Te (tellurium) or Si (silicon). The group III element in the III-V group semiconductor is, for example, Al (aluminum), Ga (gallium), or In (indium). The group V element in the III-V group semiconductor is, for example, As (arsenic) or Sb (antimony). Before the semiconductor laser device 1 is mounted on a circuit board or a package, the substrate 2 may be reduced in thickness, for example, by polishing. In this case, the thickness of the substrate 2 is set to, for example, 100 μm to 200 μm.

The first semiconductor layer stack 3 functions as a lower distributed Bragg reflector (lower DBR) and includes a plurality of semiconductor layers. The first semiconductor layer stack 3 is disposed on the principal surface 2a of the substrate 2 and includes, for example, a first superlattice layer 11, a contact layer 12, and a second superlattice layer 13. The first superlattice layer 11, the contact layer 12, and the second superlattice layer 13 are stacked in this order in the direction T on the principal surface 2a of the substrate 2. Specifically, the contact layer 12 is sandwiched in the direction T between the first superlattice layer 11 and the second superlattice layer 13.

The first superlattice layer 11 is an i-type semiconductor layer. The first superlattice layer 11 has a superlattice structure in which unit structures including a plurality of different semiconductor layers are stacked. Each unit structure includes, for example, an AlGaAs layer (Al content: 0.12) and an AlGaAs layer (Al content: 0.90). The number of unit structures included in the first superlattice layer 11 is, for example, 50 to 100. The thickness of the first superlattice layer 11 is, for example, 4,000 nm to 6,000 nm.

The contact layer 12 is a single n-type semiconductor layer in contact with the electrodes 9 in the semiconductor laser device 1. The contact layer 12 is, for example, a Si-doped GaAs layer. The contact layer 12 includes a first portion 12a and a second portion 12b that may differ in thickness. The first portion 12a is in contact with the electrodes 9 and is a portion (first remaining portion) located outside the semiconductor mesa M in plan view. The first portion 12a of the contact layer 12 has a thickness equal to or less than the thickness of the second portion 12b. In terms of contact resistance, the thickness of the first portion 12a is, for example, 250 nm to 500 nm. The second portion 12b is a portion (second remaining portion) forming a part of the semiconductor mesa M. The thickness of the second portion 12b is equal to or larger than the thickness of the first portion 12a and is, for example, 500 nm or less.

The second superlattice layer 13 is an n-type semiconductor layer (n-type first semiconductor layer) and is disposed on the second portion 12b of the contact layer 12. The second superlattice layer 13 has a superlattice structure in which unit structures including a plurality of different semiconductor layers are stacked, as does the first superlattice layer 11. Each unit structure includes, for example, an AlGaAs layer (Al content: 0.12) and an AlGaAs layer (Al content: 0.90). The number of unit structures included in the second superlattice layer 13 is, for example, 10 to 30. The second superlattice layer 13 is doped with, for example, Si, which is an n-type impurity. The thickness of the second superlattice layer 13 is, for example, 1,000 nm to 2,000 nm.

The active layer 4 is a semiconductor layer in which electrons and holes are recombined to generate light. The active layer 4 is disposed on the second superlattice layer 13 of the first semiconductor layer stack 3. The active layer 4 includes a lower spacer layer 21, a multi quantum well (MQW) structure 22, and an upper spacer layer 23. The lower spacer layer 21, the MQW structure 22, and the upper spacer layer 23 are stacked in this order in the direction T on the first semiconductor layer stack 3. Specifically, the MQW structure 22 is sandwiched in the direction T between the lower spacer layer 21 and the upper spacer layer 23. The thickness of the active layer 4 is, for example, 50 nm to 300 nm.

The lower spacer layer 21 is sandwiched in the direction T between the second superlattice layer 13 and the MQW structure 22 and is an n-type semiconductor layer containing an n-type dopant. The lower spacer layer 21 is, for example, a Si-doped AlGaAs layer (Al content: 0.30). The MQW structure 22 includes, for example, GaAs layers serving as well layers and AlGaAs layers serving as barrier layers, and these layers are stacked alternately. The upper spacer layer 23 includes an undoped semiconductor layer and a p-type semiconductor layer containing a p-type dopant. The undoped semiconductor layer is, for example, an AlGaAs layer (Al content: 0.30). The p-type semiconductor layer is, for example, an AlGaAs layer (Al content: 0.90) containing Zn (zinc). The p-type dopant used may be Be (beryllium), Mg (magnesium), C (carbon), or Zn.

The current confinement layer 5 is a semiconductor layer for confining an electric current (carriers) injected into the active layer 4 in the semiconductor mesa M. The current confinement layer 5 is formed from, for example, an AlGaAs layer (Al content: 0.98) and includes a high-resistance portion 31 and a low-resistance portion 32. The high-resistance portion 31 is disposed so as to surround the low-resistance portion 32 as viewed in the direction T, and aluminum oxide is formed in the high-resistance portion 31. The low-resistance portion 32 has a lower electrical resistance than that of the high-resistance portion 31 and does not contain the aluminum oxide. The thickness of the current confinement layer 5 is, for example, 10 nm to 50 nm. In the current confinement layer 5, the electric current is concentrated in the low-resistance portion 32 and is thereby confined.

The second semiconductor layer stack 6 functions as an upper distributed Bragg reflector (upper DBR) and includes a plurality of semiconductor layers. The second semiconductor layer stack 6 is disposed on the current confinement layer 5 and includes, for example, a superlattice layer 41 and a contact layer 42. The superlattice layer 41 and the contact layer 42 are stacked in this order in the direction T on the current confinement layer 5.

The superlattice layer 41 is a p-type semiconductor superlattice layer (p-type second semiconductor layer). The superlattice layer 41 has a superlattice structure in which unit structures are stacked, as does the first superlattice layer 11. Each unit structure includes, for example, an AlGaAs layer (Al content: 0.12) and an AlGaAs layer (Al content: 0.90). The number of unit structures included in the superlattice layer 41 is, for example, 50 to 100. The thickness of the superlattice layer 41 is, for example, 3,000 nm to 5,000 nm. The superlattice layer 41 is doped with, for example, Zn which is a p-type dopant. The contact layer 42 is a single p-type semiconductor layer in contact with the electrodes 8 in the semiconductor laser device 1. The contact layer 42 is, for example, a GaAs layer doped with a p-type dopant such as Zn. The thickness of the contact layer 42 is, for example, 100 nm to 300 nm.

The insulating layer 7 functions as a protective film for the semiconductor layers in the semiconductor laser device 1 and is formed from, for example, an inorganic insulating layer. The inorganic insulating layer is, for example, a silicon oxide film, a silicon nitride film, or a silicon oxynitride film. The insulating layer 7 has openings 7a located on the semiconductor mesa M and openings 7b spaced apart from the semiconductor mesa M. The openings 7a and 7b are formed so as to pass through the insulating layer 7 in the direction T. Therefore, the contact layer 42 is exposed through the openings 7a. The first portion 12a of the contact layer 12 is exposed through the openings 7b. A plurality of the openings 7a and a plurality of the openings 7b are provided, but only one opening 7a and only one opening 7b may be provided. In order to obtain the insulating layer 7 having high reflectivity for light emitted from the semiconductor laser device 1, the thickness of the insulating layer 7 may be set to be 200 nm to 500 nm.

The electrodes 8 are disposed on the semiconductor mesa M. The electrodes 8 are formed in the openings 7a. The electrodes 8 are in contact with the contact layer 42 through the openings 7a. The electrodes 8 each have a layered structure including, for example, a titanium layer, a platinum layer, and a gold layer.

The electrodes 9 are spaced apart from the semiconductor mesa M. The electrodes 9 are formed in the openings 7b. The electrodes 9 are in contact with the first portion 12a of the contact layer 12 through the openings 7b. The electrodes 9 are each, for example, a gold-germanium-nickel alloy layer.

Figure 2:
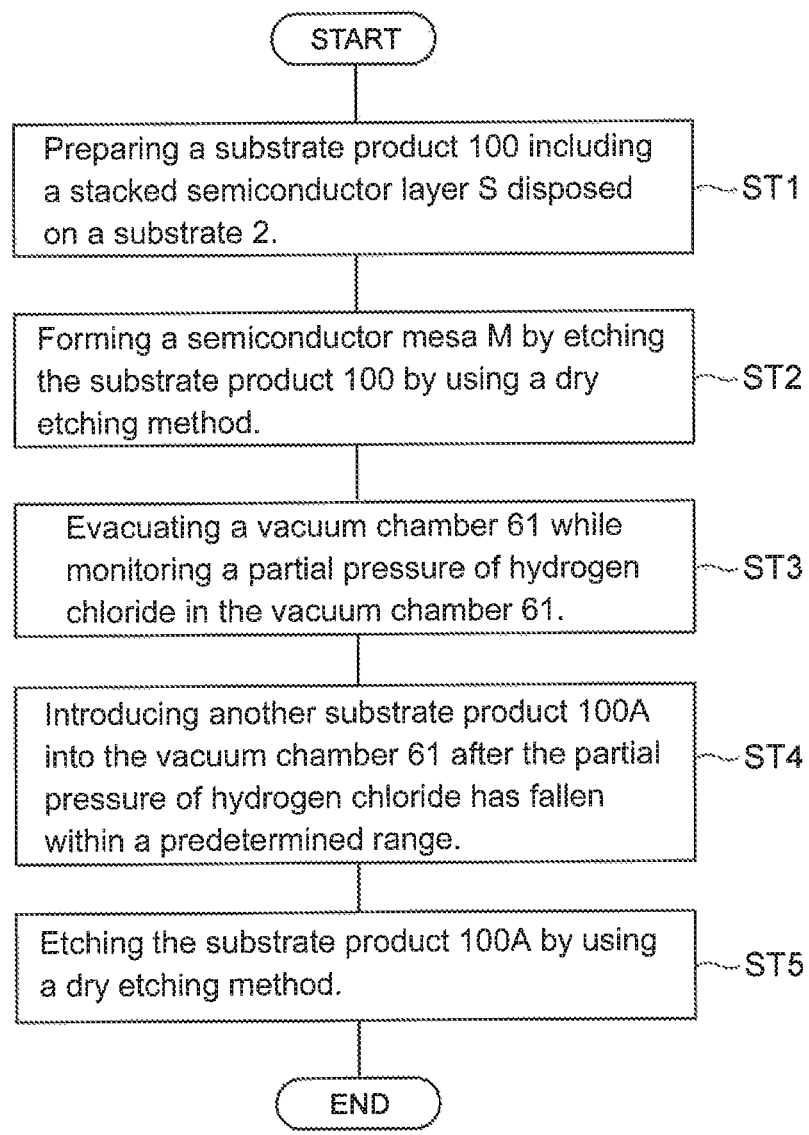
FIG. 2 is a flowchart showing the first half of a semiconductor laser device production method according to the present embodiment.
Figure 3:
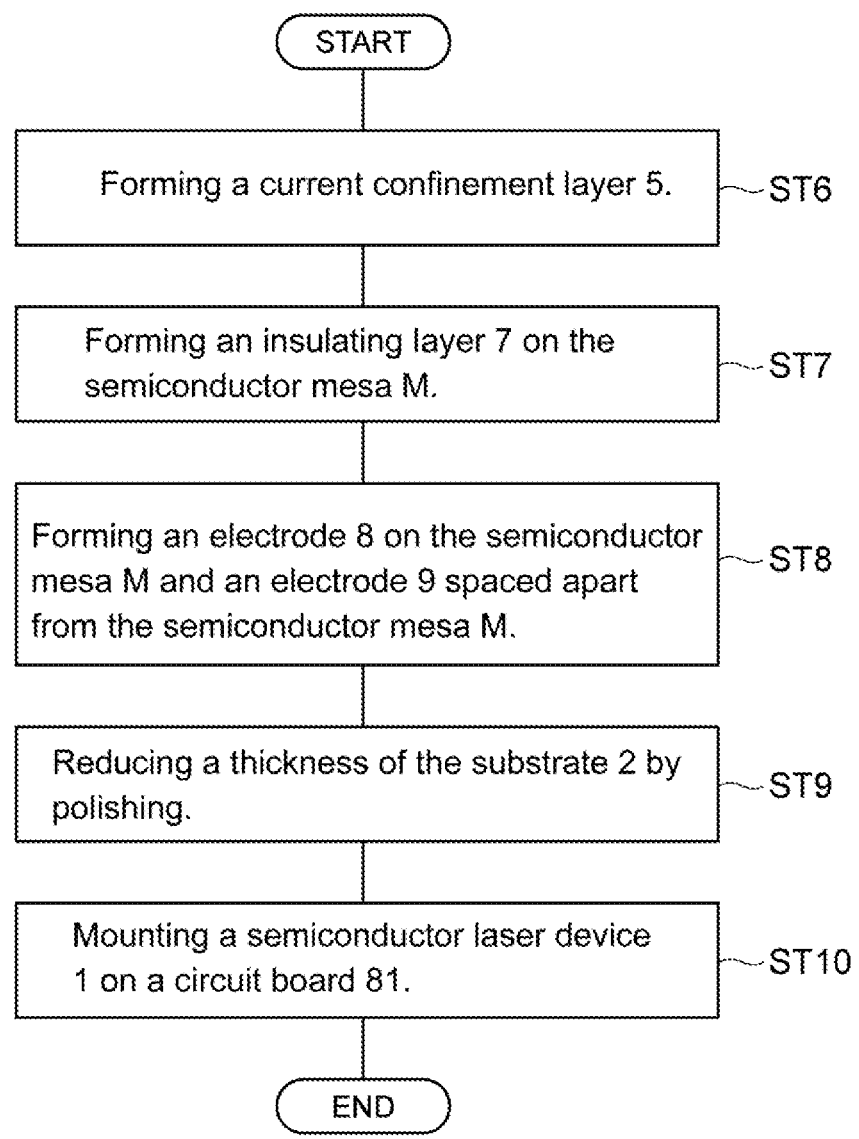
FIG. 3 is a flowchart showing the second half of the semiconductor laser device production method according to the present embodiment.
Figure 5A:
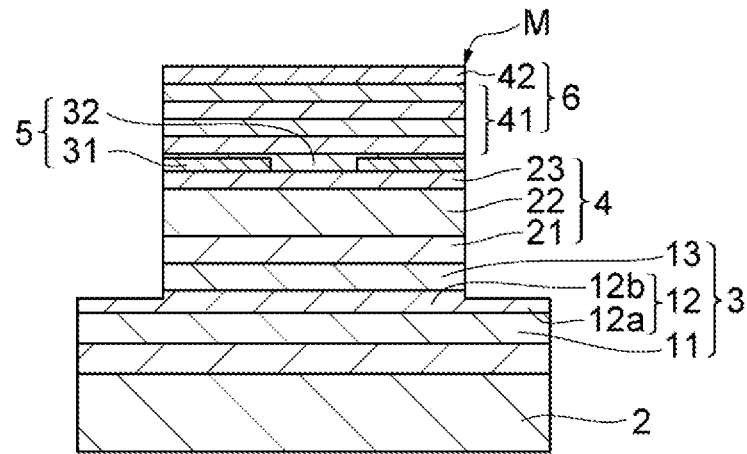
FIGS. 5A to 5C are cross-sectional views illustrating the semiconductor laser device production method according to the present embodiment.
Figure 5B:
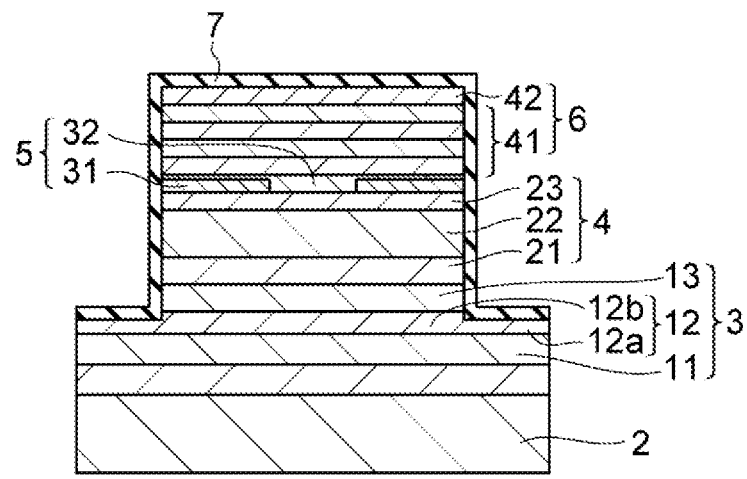
Figure 5C:
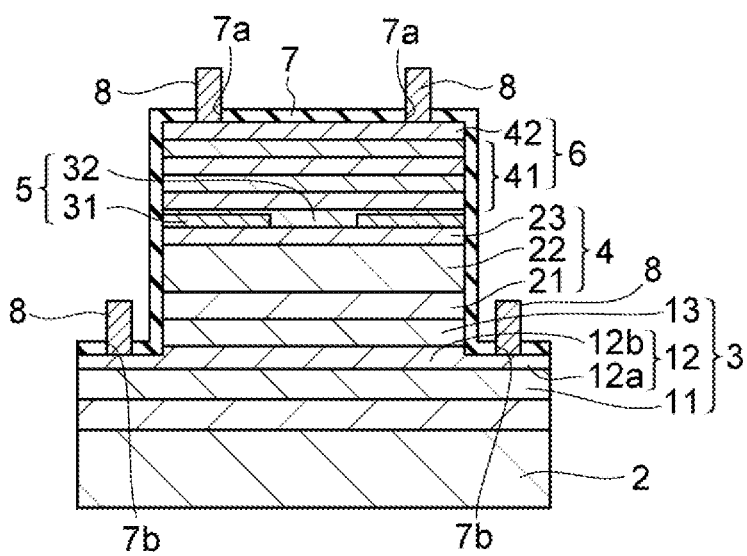
Figure 6A:
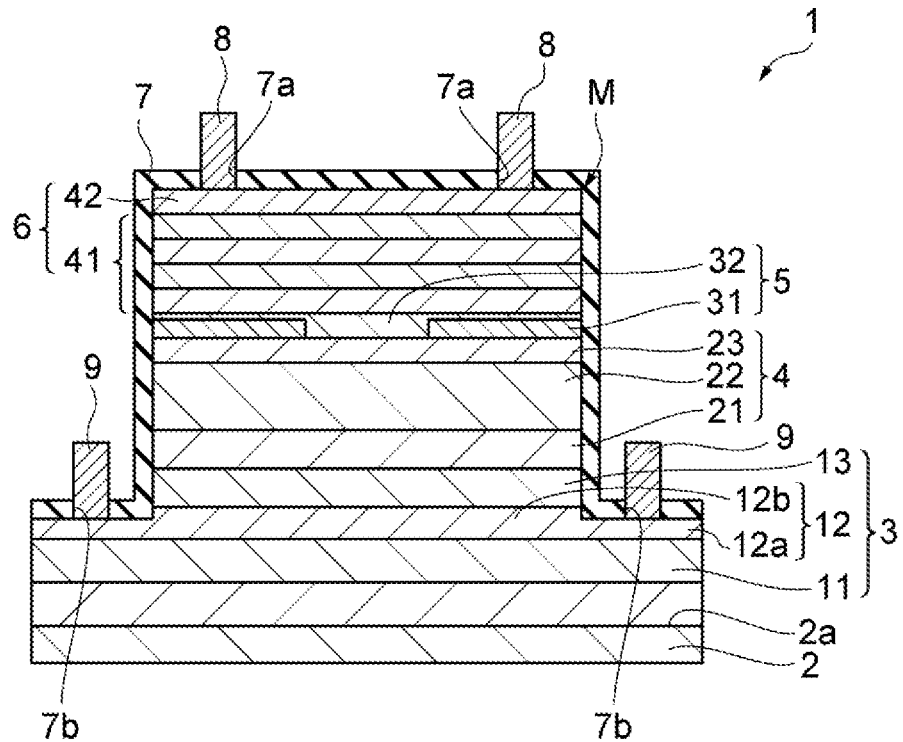
FIGS. 6A and 6B are cross-sectional views illustrating the semiconductor laser device production method according to the present embodiment.
Figure 6B:
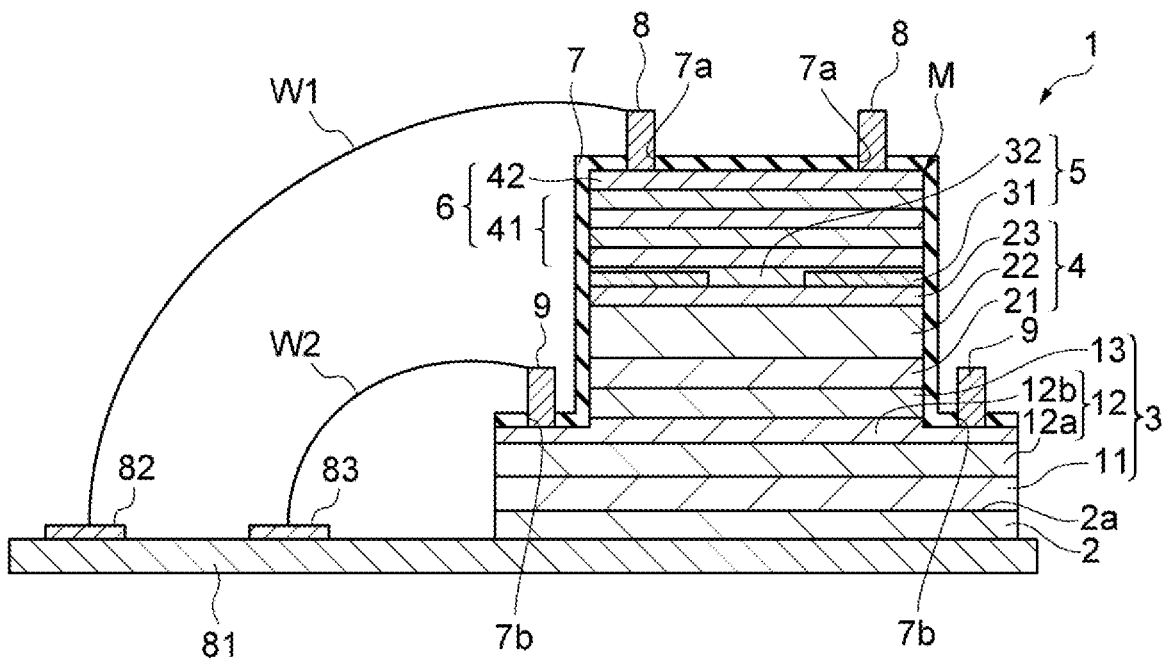
Figure 7:
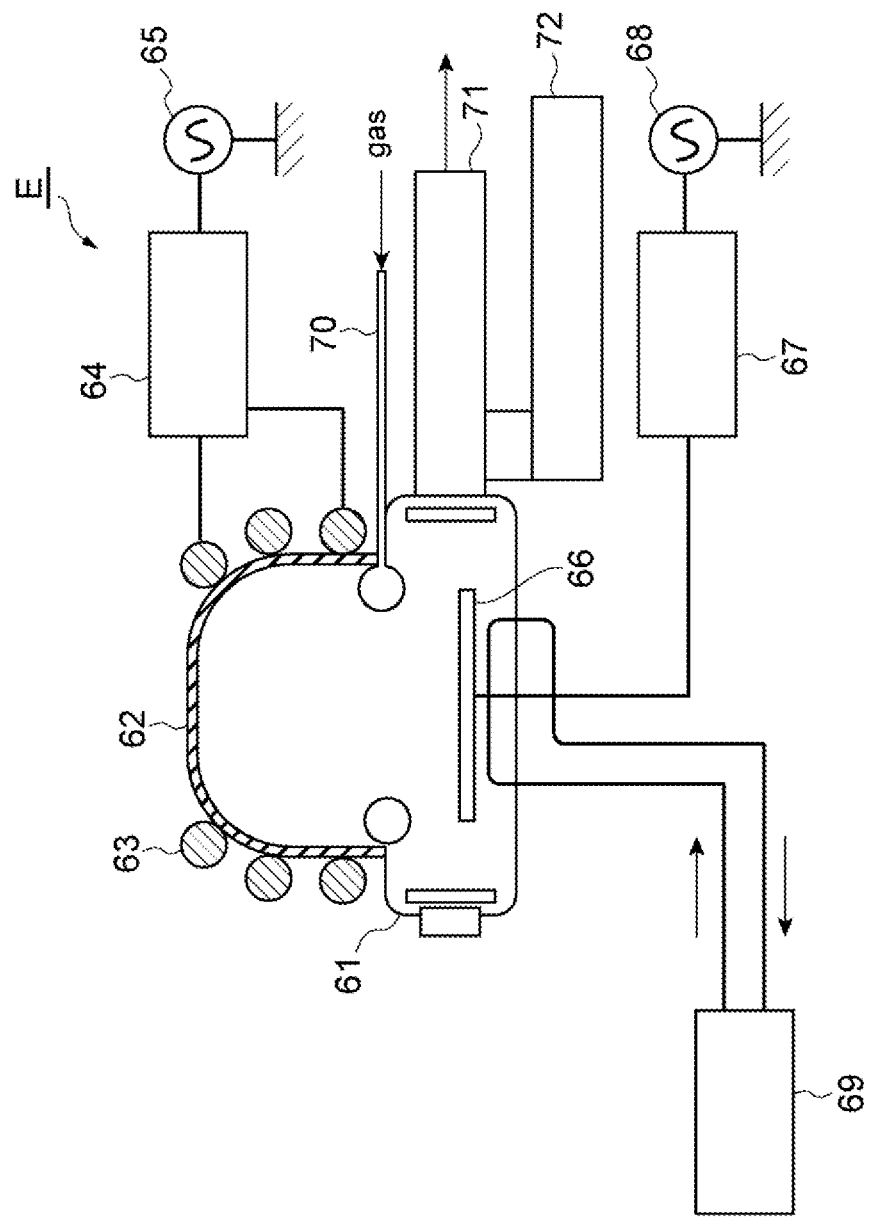
FIG. 7 is a schematic diagram of a dry etching apparatus.
Figure 8:
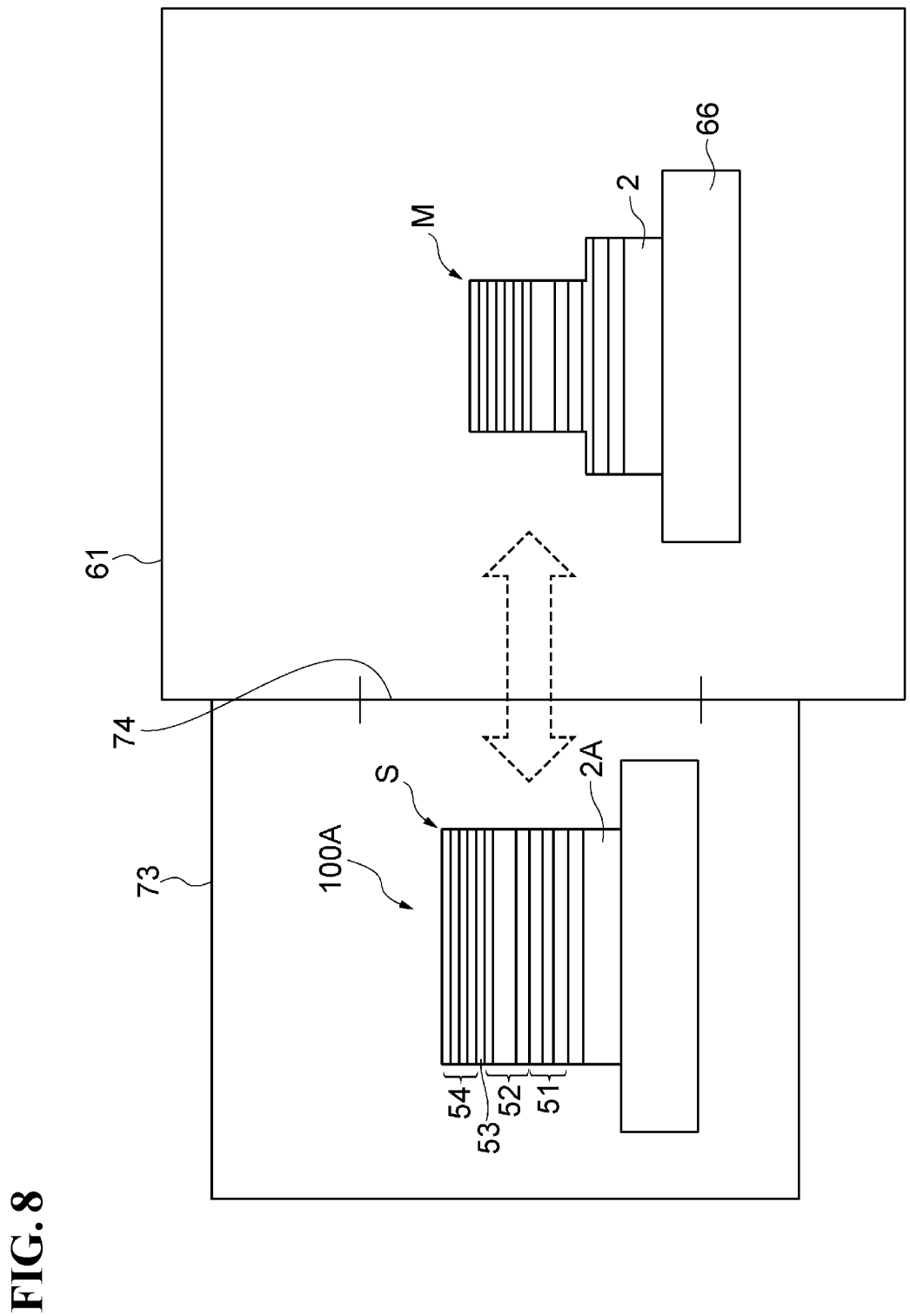
FIG. 8 is a schematic diagram showing a vacuum chamber and a load lock chamber.

Referring next to FIGS. 2, 3, 4A, 4B, 5A to 5C, 6A, 6B, 7, and 8, a method of producing a semiconductor laser device according to the present embodiment will be described. FIG. 2 is a flowchart showing the first half of the method of producing the semiconductor laser device according to the present embodiment. FIG. 3 is a flowchart showing the second half of the method of producing the semiconductor laser device according to the present embodiment. FIGS. 4A, 4B, 5A to 5C, 6A, and 6B are cross-sectional views illustrating the method of producing the semiconductor laser device. FIG. 7 is a schematic diagram of a dry etching apparatus. FIG. 8 is a schematic diagram showing a vacuum chamber and a load lock chamber. In FIG. 8, the shape of the vacuum chamber 61 shown in FIG. 7 is further simplified.

Figure 4A:
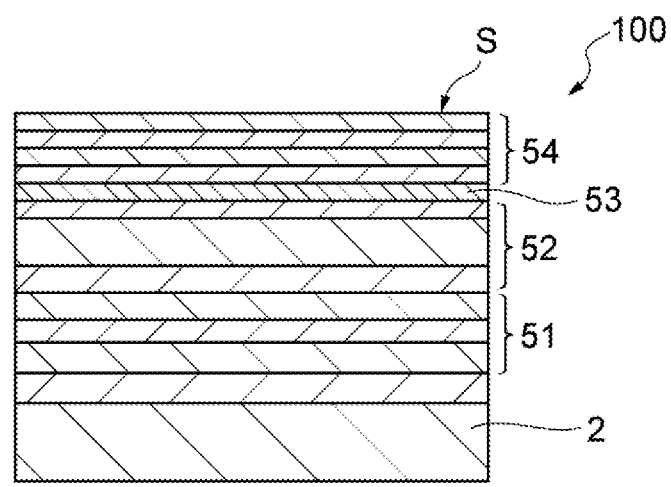
FIGS. 4A and 4B are cross-sectional views illustrating the semiconductor laser device production method according to the present embodiment.

The first half of the method of producing the semiconductor laser device 1 will be described using FIGS. 2, 4A, 4B, 7, and 8. First, in a preparation step (first process step ST1), a substrate product 100 (first substrate product) including a substrate 2 and a stacked semiconductor layer S is prepared as shown in FIGS. 2 and 4A. In the first process step ST1, the stacked semiconductor layer S formed on the substrate 2 includes semiconductor layers 51, 52, 53, and 54. The semiconductor layers 51, 52, 53, and 54 later become the first semiconductor layer stack 3, the active layer 4, the current confinement layer 5, and the second semiconductor layer stack 6, respectively. The semiconductor layers 51 to 54 are successively formed on the substrate 2 by using a molecular beam epitaxial growth method or a metal-organic vapor phase epitaxy method. Next, in the first process step ST1, an unillustrated mask is formed on the stacked semiconductor layer S. This mask has at least one of hydrophobicity and water impermeability and is, for example, a silicon nitride film.

Figure 4B:
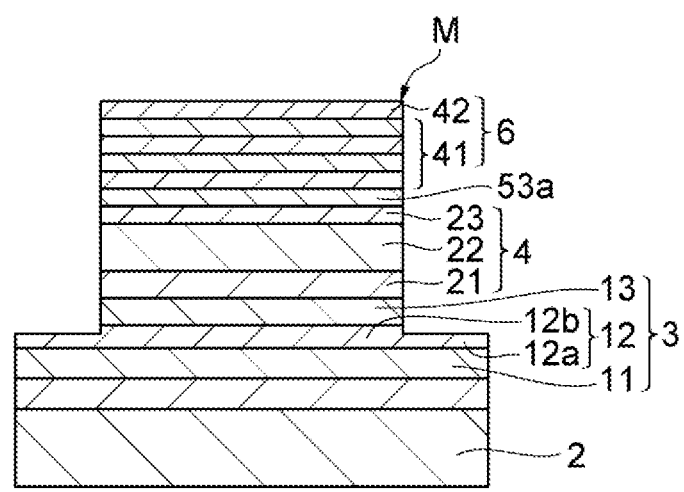

Next, as shown in FIGS. 2 and 4B, the substrate product 100 is etched by using a dry etching method to form the semiconductor mesa M (a second process step ST2 or a first step). In the second process step ST2, the substrate product 100 is first introduced into the vacuum chamber 61 of the dry etching apparatus E shown in FIG. 7. Next, an etching gas is supplied to the vacuum chamber 61 to dry-etch the stacked semiconductor layer S. In this manner, portions of the semiconductor layers 51 to 54 not covered with the mask are removed, and the first portion 12a of the remaining contact layer 12 is exposed. The semiconductor mesa M including the second portion 12b of the remaining contact layer 12 is thereby formed. A plurality of the semiconductor mesas M is disposed on the substrate 2. At the time of completion of the second process step ST2, the high-resistance portion 31 is not formed in a semiconductor layer 53a later serving as the current confinement layer 5.

Next, the dry etching apparatus E will be described using FIG. 7. The dry etching apparatus E is an inductive coupled plasma reactive ion etching (ICP-RIE) apparatus. Therefore, in the second process step ST2, a reactive ion etching (RIE) method is used to remove portions of the semiconductor layers 51 to 54 that are not covered with the mask in the stacked semiconductor layer S. The dry etching apparatus E includes the vacuum chamber 61, a dielectric substance-made dome 62 connected to the vacuum chamber 61, a coil 63, an impedance matching box 64, a high-frequency power supply (ICP output power supply) 65, a lower electrode 66, an impedance matching box 67, a high-frequency power supply (bias output power supply) 68, a cooling unit 69, a gas supply unit 70, an exhaust unit 71, and a mass spectrometer 72. The coil 63 is disposed so as to surround the dome 62. The impedance matching box 64 and the high-frequency power supply 65 are electrically connected to the coil 63. The lower electrode 66 is disposed inside the vacuum chamber 61, and the substrate 2 is placed on the lower electrode 66. The impedance matching box 67 and the high-frequency power supply 68 are electrically connected to the lower electrode 66. The cooling unit 69 supplies and circulates He to cool the lower electrode 66. The etching gas is supplied to the vacuum chamber 61 through the gas supply unit 70. Gases such as the etching gas are discharged through the exhaust unit 71 to the outside of the vacuum chamber 61. The mass spectrometer 72 is used to, for example, analyze the partial pressures of gases in the vacuum chamber 61. In the second process step ST2, ICP power is set to, for example, 50 W to 1,000 W. BIAS power is set to, for example, 50 W to 500 W. In the vacuum chamber 61, its vacuum state is maintained, for example, by a vacuum pump attached to the exhaust unit 71 (i.e., the vacuum chamber 61 is evacuated). The vacuum state is a state in which the pressure in the vacuum chamber 61 is $1.0 \times 10^{-3}$ Pa or less. The temperature of the substrate 2 may be maintained at 25° C. or lower using the cooling unit 69. The gases described above include water vapor.

The etching gas supplied to the dry etching apparatus E is a chlorine-based gas and is, for example, $BCl_3$ gas or a gas mixture of $BCl_3$ and $Cl_2$. In addition to the chlorine-based gas, an inert gas (such as Ar gas) is supplied to the vacuum chamber 61. The total flow rate of the gases supplied to the vacuum chamber 61 in the second process step ST2 is, for example, 100 sccm. When the chlorine-based gas is $BCl_3$ gas, the flow rate of the $BCl_3$ gas is set to, for example, 30 sccm, and the flow rate of the Ar gas is set to, for example, 70 sccm. When the chlorine-based gas is the above gas mixture, the flow rate of the $BCl_3$ gas is set to, for example, 20 sccm, the flow rate of the $Cl_2$ gas is set to, for example, 10 sccm, and the flow rate of the Ar gas is set to, for example, 70 sccm.

Returning to FIG. 2, after the second process step ST2, the vacuum chamber 61 is evacuated while the partial pressure of hydrogen chloride in the vacuum chamber 61 is monitored (a third process step ST3 or a second step). In the third process step ST3, the vacuum chamber 61 is evacuated until the mass spectrometer 72 indicates that the partial pressure of the hydrogen chloride in the vacuum chamber 61 has fallen within a predetermined range. For example, the vacuum chamber 61 is evacuated until the mass spectrometer 72 indicates that the partial pressure of the hydrogen chloride in the vacuum chamber 61 has fallen within the range of from $2 \times 10^{-5}$ Pa to $5 \times 10^{-5}$ Pa. In this manner, the hydrogen chloride generated in the second process step ST2 is discharged from the vacuum chamber 61. The partial pressure of the hydrogen chloride in the vacuum chamber 61 is the pressure exerted by the hydrogen chloride and is an indicator of the ratio of the hydrogen chloride in the gases in the vacuum chamber 61. Hydrogen chloride is generated when water adheres to chlorides which are reaction products of the chlorine-based gas and elements contained in the stacked semiconductor layer S. In order to reduce the change in the rate of etching of the stacked semiconductor layer S with hydrogen chloride, the vacuum chamber 61 is evacuated for more than 30 minutes. In addition, in order to improve the productivity for the semiconductor laser device 1, the vacuum chamber 61 is evacuated for less than 1 hour.

The etching rate is the thickness of the stacked semiconductor layer S that is removed per unit time.

In the third process step ST3, to oxidize the chlorides in order to prevent the generation of hydrogen chloride, an oxygen plasma may be generated in the vacuum chamber 61. In the third process step ST3, to facilitate removal of water in the vacuum chamber 61, the interior of the vacuum chamber 61 may be heated. In this manner, water diffusing inside the vacuum chamber 61 is discharged, and the partial pressure of water in the vacuum chamber 61 may be reduced to, for example, $1 \times 10^{-6}$ Pa or less.

Next, as shown in FIGS. 2 and 8, after confirmation that the partial pressure of the hydrogen chloride has fallen within the predetermined range, a substrate product 100A (second substrate product) different from the substrate product 100 is introduced into the vacuum chamber 61 while the vacuum state inside the vacuum chamber 61 is maintained (a fourth process step ST4 or a second step). In the fourth process step ST4, the substrate product 100A is first introduced into a load lock chamber 73 connected to the vacuum chamber 61. The load lock chamber 73 is divided from the vacuum chamber 61 by an openable gate 74. The substrate product 100A differs from the substrate product 100 shown in the first process step ST1 to the third process step ST3. The substrate product 100A includes a substrate 2A and a stacked semiconductor layer S disposed on the substrate 2A. The stacked semiconductor layer S includes the semiconductor layers 51 to 54. When the load lock chamber 73 containing the substrate product 100A is evacuated within a predetermined pressure (vacuum), the gate 74 connecting the load lock chamber 73 to the vacuum chamber 61 is opened. Next, a robot arm (not shown), for example, is used to place the substrate product 100A on the lower electrode 66 of the vacuum chamber 61. In this case, the substrate 2 on which the semiconductor mesas M have been disposed is transferred to the load lock chamber 73. Then the gate 74 is closed. In this manner, the substrate 2 with the semiconductor mesas M formed thereon is removed from the vacuum chamber 61, and the substrate product 100A is introduced into the vacuum chamber 61.

Next, as shown in FIG. 2, the substrate product 100A introduced into the vacuum chamber 61 in the fourth process step ST4 is dry-etched with the chlorine-based gas in the vacuum chamber 61 (a fifth process step ST5 or a third step). The fifth process step ST5 is the same process step as the second process step ST2. Therefore, in the fifth process step ST5, the substrate product 100A is dry-etched so as to form semiconductor mesas M on the substrate 2A. As described above, by performing the first process step ST1 to the fifth process step ST5, the different substrate products 100 and 100A may be dry-etched with the partial pressure of the hydrogen chloride adjusted within the predetermined range in the vacuum chamber 61. After the fifth process step ST5, the third process step ST3 to the fifth process step ST5 may be repeated many times. In this case, a plurality of substrate products may be dry-etched with the partial pressure of the hydrogen chloride adjusted within the predetermined range in the vacuum chamber 61. In other words, by repeating the second process step ST2 to the fourth process step ST4, a plurality of substrate products can be dry-etched with the partial pressure of the hydrogen chloride adjusted within the predetermined range in the vacuum chamber 61.

Next, the second half of the method of producing the semiconductor laser device 1 will be described with reference to FIGS. 3, 4A, 4B, 5A to 5C, 6A, and 6B. The second half of the method of producing the semiconductor laser device 1 will be described using the substrate 2 having the semiconductor mesas M formed thereon and removed from the vacuum chamber 61 in the fourth process step ST4. Therefore, the second half of the method of producing the semiconductor laser device 1 is performed after the fourth process step ST4.

First, as shown in FIGS. 3 and 5A, the semiconductor layer 53a is partially oxidized to form the current confinement layer 5 (a sixth process step ST6). In the sixth process step ST6, the outer surface of the semiconductor layer 53a is exposed to water vapor to oxidize the semiconductor layer 53a from the outer surface side. In this manner, the current confinement layer 5 including the high-resistance portion 31 located at least on its outer circumferential surface and the low-resistance portion 32 surrounded by the high-resistance portion 31 is formed.

Next, as shown in FIGS. 3 and 5B, the insulating layer 7 covering the semiconductor mesa M is formed (a seventh process step ST7). In the seventh process step ST7, the insulating layer 7 is formed by, for example, a plasma CVD method. After the formation of the insulating layer 7, the openings 7a and the openings 7b are formed by using, for example, a dry etching method. The contact layer 42 is exposed through the openings 7a. The first portion 12a of the contact layer 12 is exposed through the openings 7b. To improve the productivity for the semiconductor laser device 1, the openings 7a and 7b may be formed simultaneously.

Next, as shown in FIGS. 3 and 5C, the electrodes 8 in contact with the contact layer 42 and the electrodes 9 in contact with the first portion 12a of the contact layer 12 are formed (an eighth process step ST8). In the eighth process step ST8, for example, the electrodes 8 are formed in the openings 7a, and then the electrodes 9 are formed in the openings 7b.

Next, as shown in FIGS. 3 and 6A, the substrate 2 is reduced in thickness (a ninth process step ST9). In the ninth process step ST9, the rear side of the substrate 2 is polished using, for example, backgrinding equipment or polishing equipment. After the substrate 2 has been reduced in thickness, the substrate 2 is diced using, for example, a dicer to form chip-shaped semiconductor laser devices 1.

Next, as shown in FIGS. 3 and 6B, a semiconductor laser device 1 is mounted on a circuit board 81 (a tenth process step ST10). In the tenth process step ST10, the semiconductor laser device 1 is die-bonded to the circuit board 81 using, for example, an adhesive. Then one of the electrodes 8 is electrically connected to an electrode 82 on the circuit board 81 through a wire W1 by wire bonding. Similarly, one of the electrodes 9 is electrically connected to an electrode 83 on the circuit board 81 through a wire W2.

Figure 9:
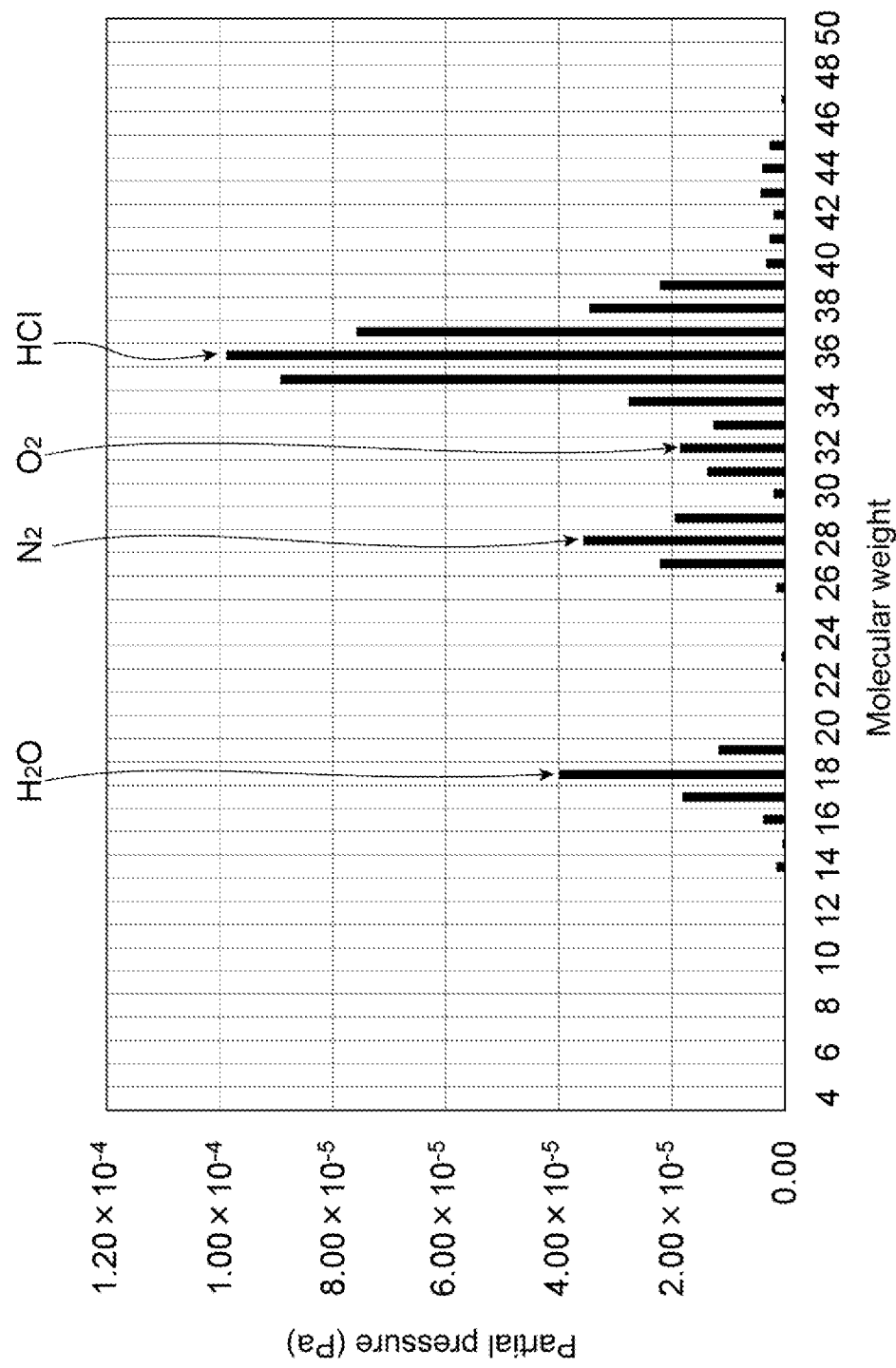
FIG. 9 is a graph showing the results of analysis by a mass spectrometer after a second process step.
Figure 10:
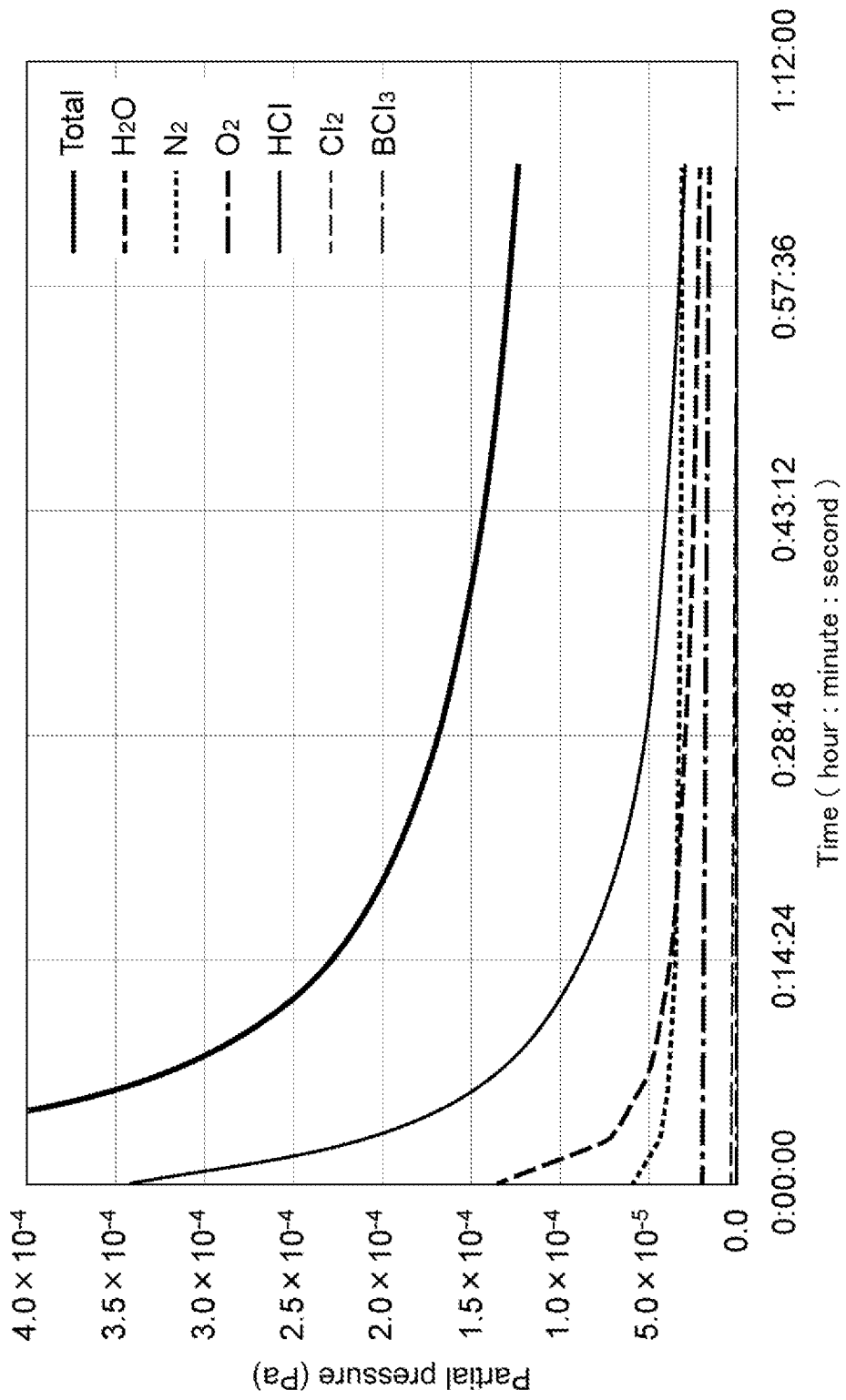
FIG. 10 is a graph showing temporal changes in the partial pressures of gases in the vacuum chamber in a third process step.
Figure 11:
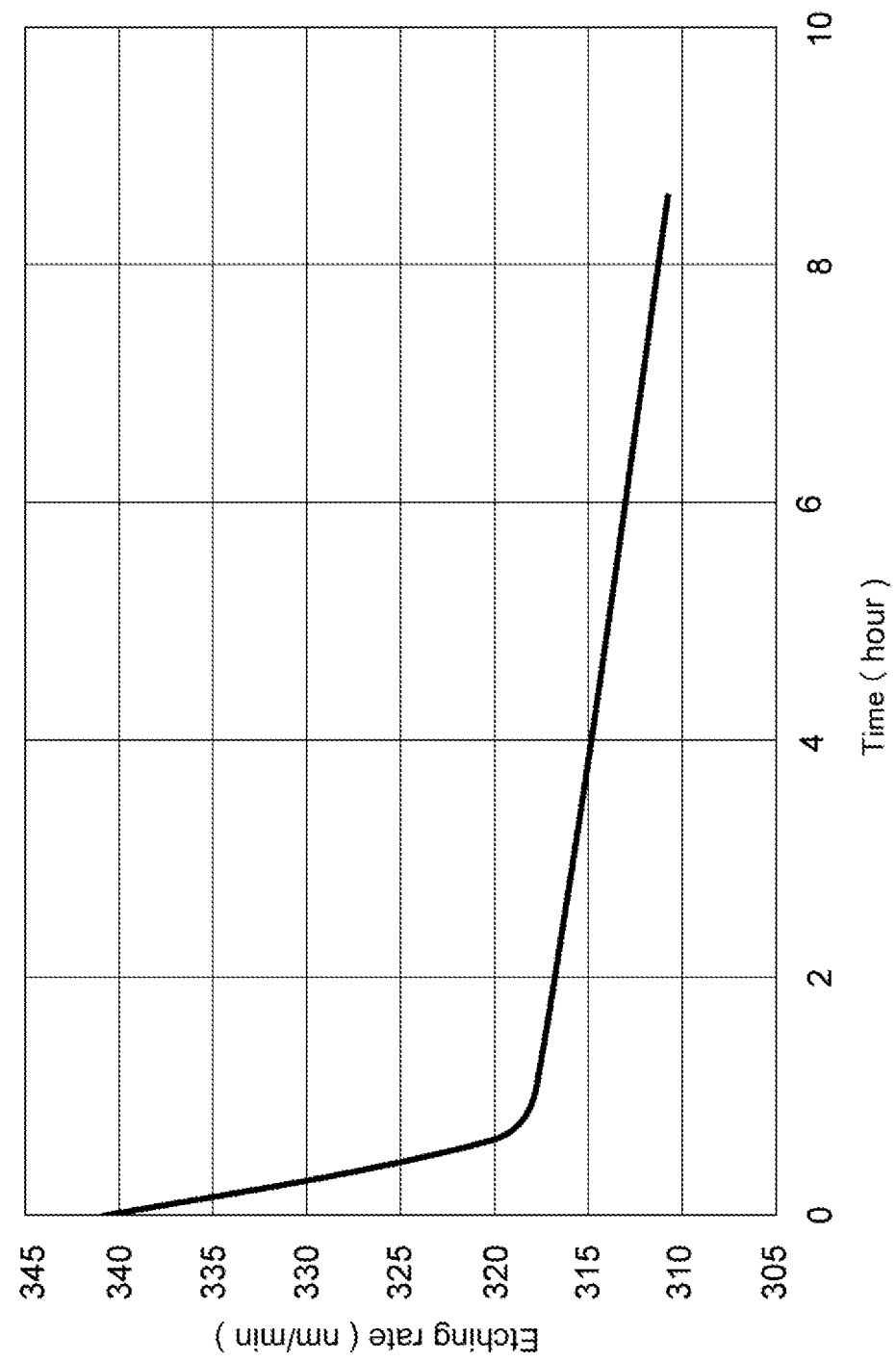
FIG. 11 is a graph showing the relation between the execution time of the third process step performed between the preceding etching process and the subsequent etching process and the etching rate in the subsequent etching process.

Referring next to FIGS. 9 to 11, the influence of hydrogen chloride on the etching rate of semiconductors will be described.

FIG. 9 is a graph showing the experiment results measured by the mass spectrometer 72 after the second process step ST2. In FIG. 9, the vertical axis represents partial pressure, and the horizontal axis represents molecular weight. When a chlorine-based gas is used to etch the stacked semiconductor layer S, as in the above-described method of producing the semiconductor laser device 1, the chlorine-based gas reacts with elements contained in the stacked semiconductor layer S. As a result, gallium chloride, aluminum chloride, arsenic chloride, etc. are generated. The gas in the vacuum chamber 61 after the second process step ST2 was subjected to mass analysis. It was found that hydrogen chloride was generated, as shown in FIG. 9. The hydrogen chloride is a chlorine-based gas, but the hydrogen chloride is not supplied to the vacuum chamber 61 in the second process step ST2. The chlorine-based gas and the inert gas were supplied in the second process step ST2, but they were almost absent in the vacuum chamber 61. It was also found that water ($H_2O$), nitrogen ($N_2$), oxygen ($O_2$), and hydrogen chloride (HCl) remained in the vacuum chamber 61. In particular, a relatively large amount of hydrogen chloride remained, and the partial pressure of the hydrogen chloride was about $1 \times 10^{-4}$ Pa in FIG. 9.

Water is a residue adhering to the inner walls of the vacuum chamber 61, the stacked semiconductor layer S, etc. It is highly probable that oxygen and nitrogen were contained in air not discharged from the vacuum chamber 61. Hydrogen chloride was not supplied to the vacuum chamber 61 in the second process step ST2 as described above. Therefore, it is highly probable that the hydrogen chloride was generated in the vacuum chamber 61 according to, for example, chemical equation 1 below. As shown by chemical equation 1 below, as long as a chloride and water are present in the vacuum chamber 61, hydrogen chloride is always generated.

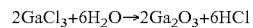

2GaCl$_3$+6H$_2$O→2Ga$_2$O$_3$+6HCl        Chemical equation 1

FIG. 10 is a graph showing temporal changes in the partial pressures of gases in the vacuum chamber 61 in the third process step ST3. In FIG. 10, the vertical axis represents partial pressure, and the horizontal axis represents the time elapsed after the start of the third process step ST3. As shown in FIG. 10, after a lapse of about 15 minutes from the start of the third process step ST3, the values of the partial pressures of water, nitrogen, oxygen, and the etching gases (Cl$_2$ and BCl$_3$) were almost stable. However, the partial pressure of the hydrogen chloride was $5 \times 10^{-5}$ Pa or less after a lapse of about 30 minutes and was $2 \times 10^{-5}$ Pa or less after a lapse of about 60 minutes. The partial pressure of the hydrogen chloride was almost unchanged after a lapse of about 60 minutes. It has been considered that gases serving as etching gases for semiconductors can be discharged when the chamber is evacuated for about 1 minute. In practice, the chlorine-based gases (Cl$_2$ and BCl$_3$) supplied as etching gases to the vacuum chamber 61 in the second process step ST2 were almost not detected in the third process step ST3. These results show that hydrogen chloride capable of serving as an etching gas tends not to be discharged from the vacuum chamber 61 to the outside. In other words, it was found that hydrogen chloride is less likely to be discharged to the outside than other chlorine-based gases. It was also found that the time conventionally used for evacuation may not be sufficient for removal of etching gases including a hydrogen chloride gas.

FIG. 11 is a graph showing the relation between the execution time of the third process step ST3 performed between the preceding etching process and the subsequent etching process and the etching rate in the subsequent etching process. In FIG. 11, the vertical axis represents the etching rate, and the horizontal axis represents the execution time of the third process step ST3. As shown in FIG. 11, when the execution time of the third process step ST3 is about 0.5 hours (about 30 minutes) or shorter, the change in the etching rate is much larger than the change when the execution time of the third process step ST3 is longer than about 0.5 hours. As can be seen from the results shown in FIGS. 10 and 11, when the partial pressure of the hydrogen chloride in the vacuum chamber 61 is $5 \times 10^{-5}$ Pa or more, the etching rate may easily change (increase). As can also be seen, when the partial pressure of the hydrogen chloride in the vacuum chamber 61 is set to $5 \times 10^{-5}$ Pa or less, the etching rate may be less likely to change.

To check the validity of the above findings, six substrate products were continuously dry-etched while the concentration of hydrogen chloride in the vacuum chamber was maintained within the predetermined range. The substrate products were dry-etched one by one. During the dry etching processes, maintenance of the vacuum chamber was not performed. The maintenance means that the vacuum chamber is cleaned to remove chlorides in the vacuum chamber. First, the vacuum chamber is open to the atmosphere, and the interior of the vacuum chamber is wiped with a damp cloth. If dry cleaning is performed, the chlorides volatilize and tend to remain present in the vacuum chamber. However, the chlorides are water-soluble. Therefore, the vacuum chamber is generally wiped with a damp cloth. After the cleaning, baking and evacuation are performed to remove water in the vacuum chamber. Generally, this maintenance takes, for example, 4 to 5 days.

The thickness of the contact layer 12 in each of the substrate products to be dry-etched was set to 500 nm, and the total thickness of the semiconductor layers above the contact layer 12 was set to 4,800 nm. To reduce the contact resistance between the contact layer 12 and the electrodes 9, dry etching was performed such that the thickness of the exposed first portion 12a of the contact layer 12 was 250 nm or more, as described above. To perform the dry etching in the manner described above, it was necessary that the etch depth of the stacked semiconductor layer be 4,800 nm to 5,050 nm or less. Suppose that the time of the dry etching performed was the same for all the dry etching processes. Then a margin of 5% or less was necessary for the etching rate. In the first dry etching process, the partial pressure of hydrogen chloride was set to $5 \times 10^{-5}$ Pa or less. In the second to sixth dry etching processes, the partial pressure of hydrogen chloride was set to the value between $2 \times 10^{-5}$ Pa and $5 \times 10^{-5}$ Pa.

Table 1 below shows the etch time, the etch depth, and the etching rate for each of the substrate products. Table 2 below shows the results of averaging of the etching rates for the substrate products. Each etching rate shown in Tables 1 and 2 is obtained by dividing a corresponding etch depth by a corresponding etch time. As can be seen from Tables 1 and 2 below, the change in etching rate was 1% or less even though the maintenance described above was not performed. The reason for these results may be that the partial pressure of hydrogen chloride in the vacuum chamber 61 was set to the value between $2 \times 10^{-5}$ Pa and $5 \times 10^{-5}$ Pa during the second to sixth dry etching processes.

TABLE I

| Number of times | Etching time (second) | Etching depth (nm) | Etching rate (nm/min.) |
|---|---|---|---|
| 1 | 929 | 4968 | 321 |
| 2 | 939 | 4955 | 317 |
| 3 | 933 | 4972 | 320 |
| 4 | 937 | 4967 | 318 |
| 5 | 942 | 4987 | 318 |
| 6 | 939 | 5001 | 320 |

TABLE II

|  | Unit | Etching rate |
|---|---|---|
| Maximum value | nm/min. | 321 |
| Minimum value | nm/min. | 317 |
| Average value | nm/min. | 319 |
| Dispersion value | nm/min. | 1.58 |
| Difference between maximum value and minimum value | nm/min. | 4 |
| Rate of change | % | 0.67 |

The effects obtained by the above-described method of producing the semiconductor laser device 1 according to the present embodiment will be described. As described above, in the second process step ST2, the stacked semiconductor layer S of the substrate product 100 is dry-etched with the chlorine-based gas in the vacuum chamber 61. Therefore, in the second process step ST2, the chlorine-based gas reacts with elements contained in the stacked semiconductor layer S, and chlorides are thereby formed. When the chlorides react with water in the vacuum chamber 61, hydrogen chloride serving as an etching gas is generated. In the above-described production method, the partial pressure of hydrogen chloride in the vacuum chamber 61 is monitored. After confirmation that the partial pressure of hydrogen chloride has fallen within the predetermined range, another substrate product 100A is introduced into the vacuum chamber 61 while the vacuum state in the vacuum chamber 61 is maintained. Then the substrate product 100A is dry-etched. In this case, the substrate product 100A may be dry-etched after the partial pressure of hydrogen chloride has been set within the predetermined range. As a result, the change in the etching rate due to the hydrogen chloride may be preferably reduced. Even though the maintenance such as exposure of the vacuum chamber to the atmosphere and wiping with a damp cloth is not performed frequently, the etching rate of the stacked semiconductor layer is unlikely to change. Therefore, variations in the characteristics of the semiconductor laser device can be reduced. In addition, by performing the above-described production method, the frequency of the maintenance can be reduced, and the efficiency of production of the semiconductor laser device 1 can be improved.

In conventional cases, the third process step ST3 is not performed. In this case, when the dry etching apparatus E is used continuously for one day, the etching rate tends to change largely. Therefore, in the conventional cases, after the dry etching apparatus E is used for one day, maintenance must be performed over 4 to 5 days. However, when the production method according to the present embodiment is used, the dry etching apparatus E may be used continuously for, for example, 5 to 6 days. Therefore, the number of substrates that may be processed in one dry etching apparatus E in, for example, one week may be significantly increased. This allows the efficiency of production of the semiconductor laser device 1 to be improved.

In the third process step ST3, the vacuum chamber may be evacuated until the partial pressure of hydrogen chloride falls within the range between $2 \times 10^{-5}$ Pa and $5 \times 10^{-5}$ Pa. In this case, variations in the etching rate of the stacked semiconductor layer S due to the hydrogen chloride may be well reduced.

In the third process step ST3, an oxygen plasma may be generated in the vacuum chamber 61. In this case, the chlorides are oxidized. For example, a chemical reaction represented by chemical equation 2 below occurs in the vacuum chamber 61. Therefore, hydrogen chloride that is a reaction product of the chlorides and water is unlikely to be generated. Since chlorine is more easily discharged from the vacuum chamber 61 than hydrogen chloride, the execution time of the third process step ST3 may be reduced.

$$4GaCl_3 + 3O_2 \rightarrow 2Ga_2O_3 + 6Cl_2 \quad \text{Chemical equation 2}$$

In the third process step ST3, the interior of the vacuum chamber 61 may be heated. In this case, water in the vacuum chamber may be easily removed. Therefore, hydrogen chloride, which is a reaction product of water and chlorides, is unlikely to be generated.

A mask having at least one of hydrophobicity and water impermeability may be formed on the stacked semiconductor layer of the substrate product. In this case, water is unlikely to adhere to the mask formed on the stacked semiconductor layer S. Therefore, the amount of water diffusing inside the vacuum chamber due to the mask may be reduced. Moreover, the partial pressure of water in the vacuum chamber 61 in the second process step ST2 and the third process step ST3 may be set to, for example, $1 \times 10^{-6}$ Pa or less.

In the third process step ST3, the mass spectrometer 72 may be used to check the partial pressure of hydrogen chloride. In this case, whether or not the partial pressure of hydrogen chloride has fallen within the predetermined range may be accurately checked.

(Second Embodiment)

Figure 12:
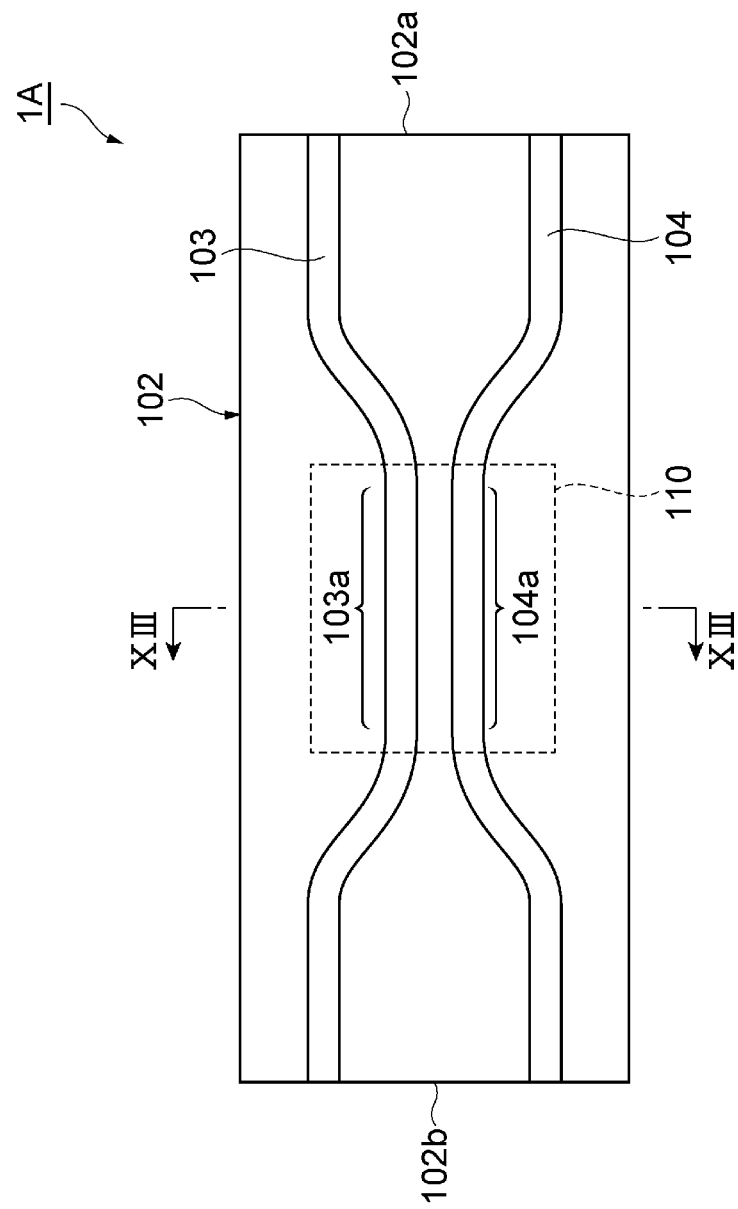
FIG. 12 is a plan view of an optical directional coupler according to a second embodiment.

FIG. 12 is a plan view of an optical directional coupler 1A according to a second embodiment. As show in FIG. 12, the optical directional coupler 1A in the present embodiment includes a substrate 102 and a pair of optical waveguides 103 and 104 disposed on the substrate 102. The substrate 102 has a substantially rectangular planar shape and has a pair of end faces 102a and 102b facing each other in a lengthwise direction of the substrate 102. The pair of optical waveguides 103 and 104 extends from one end face 102a to the other end face 102b. The optical waveguides 103 and 104 include optical waveguide portions 103a and 104a, respectively. The optical waveguide portions 103a and 104a are disposed close to each other and extend substantially parallel to each other. The optical waveguide portions 103a and 104a form an optical coupling portion 110 of the optical directional coupler 1A.

Figure 13:
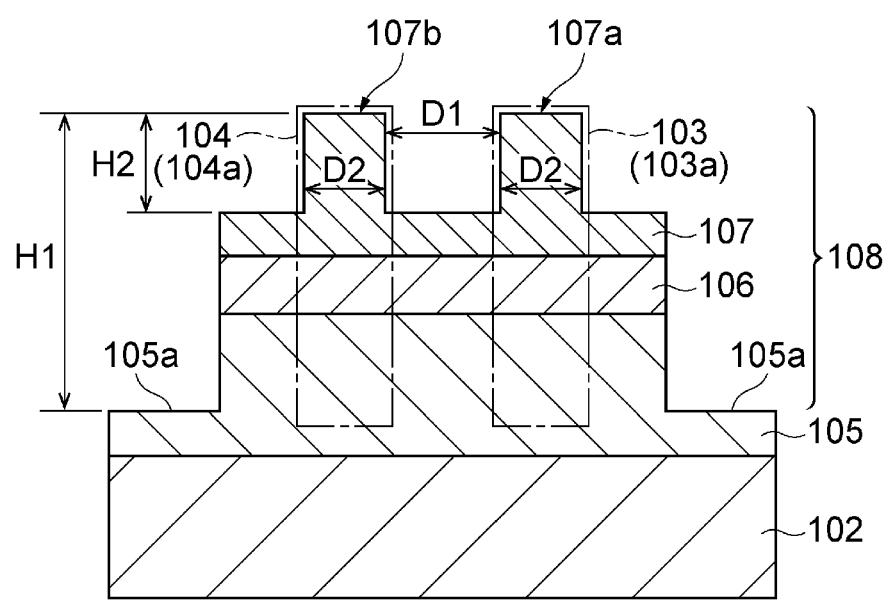
FIG. 13 is a cross-sectional view taken along line XIII-XIII in FIG. 12, illustrating the structure of optical waveguide portions in the cross section perpendicular to an optical waveguide direction.

FIG. 13 is a cross-sectional view taken along line XIII-XIII in FIG. 12. FIG. 13 shows the structure of the optical waveguide portions 103a and 104a in the cross-section perpendicular to an optical waveguide direction. As shown in FIG. 13, the optical directional coupler 1A includes a lower cladding layer 105 (first cladding layer) disposed on the substrate 102, a core layer 106 disposed on the lower cladding layer 105, and an upper cladding layer 107 (second cladding layer) disposed on the core layer 106. The lower cladding layer 105, the core layer 106, and the upper cladding layer 107 are etched to an intermediate point of the lower cladding layer 105 in their depth direction to thereby form a mesa-shaped portion 108. The upper cladding layer 107 has a pair of ridges 107a and 107b that are formed by etching the upper cladding layer 107 from its upper surface to an intermediate point in the depth direction. The optical waveguide portion 103a includes the ridge 107a, and the optical waveguide portion 104a includes the ridge 107b. Specifically, a refractive index distribution in a direction crossing the optical waveguide direction is formed by the pair of ridges 107a and 107b, and light is confined in each of the optical waveguide portions 103a and 104a because of the refractive index distribution.

The substrate 102 is a group semiconductor substrate and is, for example, an InP substrate. The lower cladding layer 105 and the upper cladding layer 107 are, for example, undoped InP layers. The core layer 106 is made of a semiconductor material having a larger refractive index than the lower cladding layer 105 and the upper cladding layer 107 and is, for example, an InGaAsP layer. The thickness of the lower cladding layer 105 in the mesa-shaped portion 108 is, for example, 1 μm to 3 μm and is 2 μm in one example. The thickness of the core layer 106 is, for example, 0.1 μm to 0.5 μm and is 0.3 μm in the example. The thickness of the upper cladding layer 107 including the ridges 107a and 107b is, for example, 1 μm to 3 μm and is 2 μm in the example. The height H1 of the mesa-shaped portion 108 is, for example, 3 μm. The height H2 of the ridges 107a and 107b is, for example, within the range of 0.5 μm to 2 μm and is 1.5 μm in the example. The distance D1 between the ridges 107a and 107b is, for example, within the range of 0.5 μm to 1 μm and is 1.0 μm in the example. The width D2 of the ridges 107a and 107b is, for example, within the range of 1 μm to 3 μm and is 2.5 μm in the example.

Figure 14:
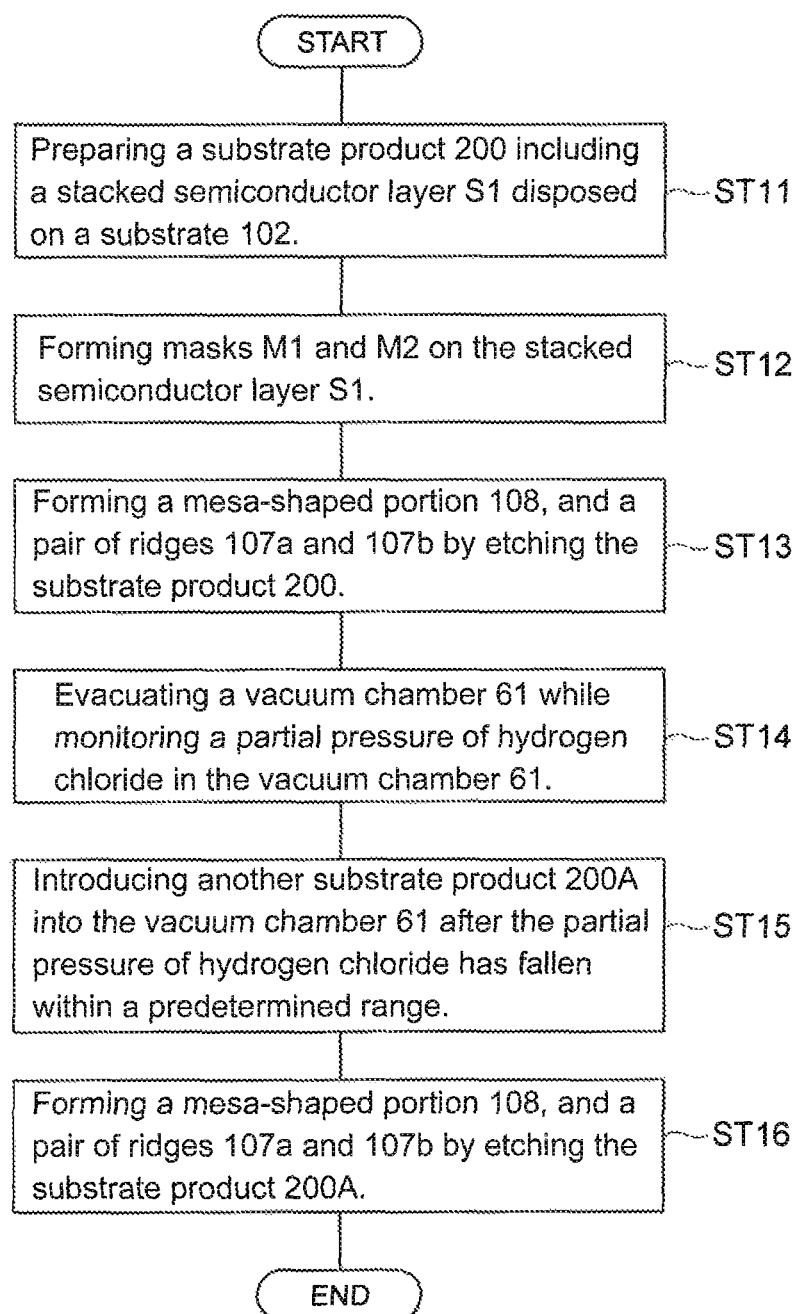
FIG. 14 is a flowchart showing an optical directional coupler production method according to the second embodiment.

Referring next to FIGS. 14, 15A, 15B, 16A, and 16B, a method of producing the optical directional coupler 1A according to the present embodiment will be described. FIG. 14 is a flowchart showing the method of producing the optical directional coupler 1A according to the present embodiment. FIGS. 15A, 15B, 16A, and 16B are cross-sectional views for illustrating the method of producing the optical directional coupler 1A according to the present embodiment.

Figure 15A:
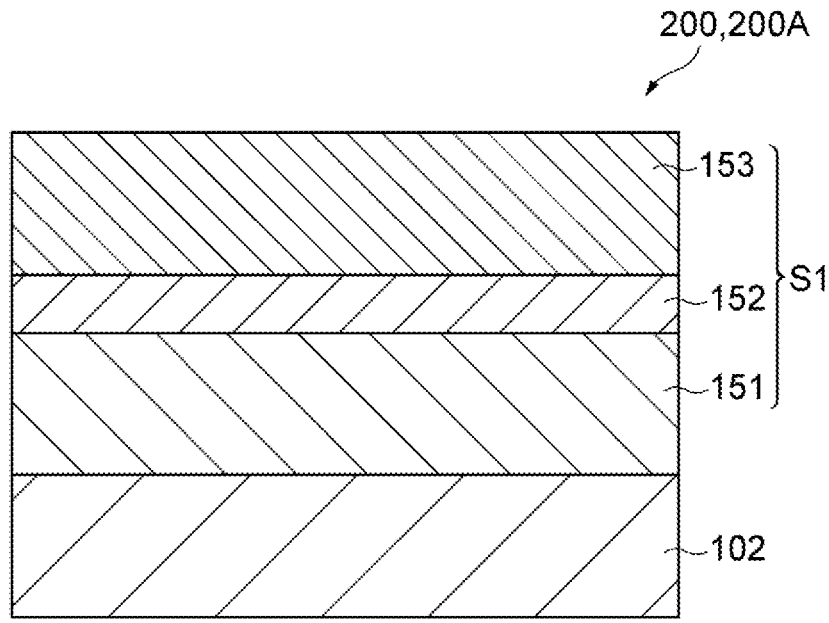
FIGS. 15A and 15B are cross-sectional views illustrating the optical directional coupler production method according to the second embodiment.
Figure 15B:
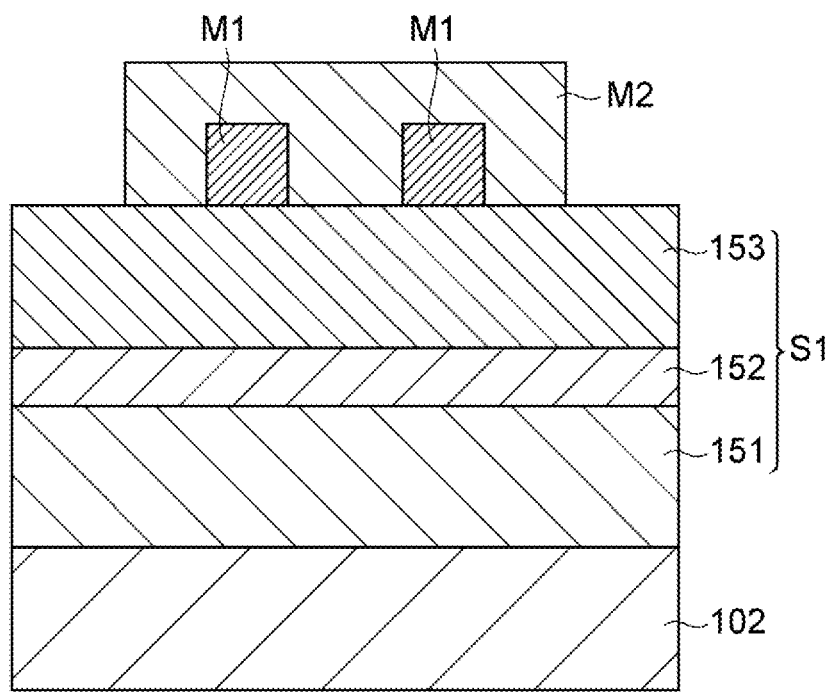

First, a preparation step is performed. As shown in FIG. 15A, a substrate product 200 (first substrate product) including a substrate 102 and a stacked semiconductor layer S1 formed thereon is prepared (step ST11). In step ST11, the stacked semiconductor layer S1 including a semiconductor layer 151, a semiconductor layer 152, and a semiconductor layer 153 is formed on the substrate 102. The semiconductor layer 151, the semiconductor layer 152, and the semiconductor layer 153 later become the lower cladding layer 105, the core layer 106, and the upper cladding layer 107, respectively. These semiconductor layers 151 to 153 are formed successively on the substrate 102 using a molecular beam epitaxial growth method or a metal-organic vapor phase epitaxy method. Next, as shown in FIG. 15B, in step ST12, a pair of masks M1 is formed on the stacked semiconductor layer S1. The pair of masks M1 is used to form the ridges 107a and 107b. The pair of masks M1 has at least one of hydrophobicity and water impermeability and are each, for example, a silicon nitride film. Then a mask M2 is formed on the stacked semiconductor layer S1 so as to cover the masks M1. The mask M2 is a resin film such as a resist film.

Figure 16A:
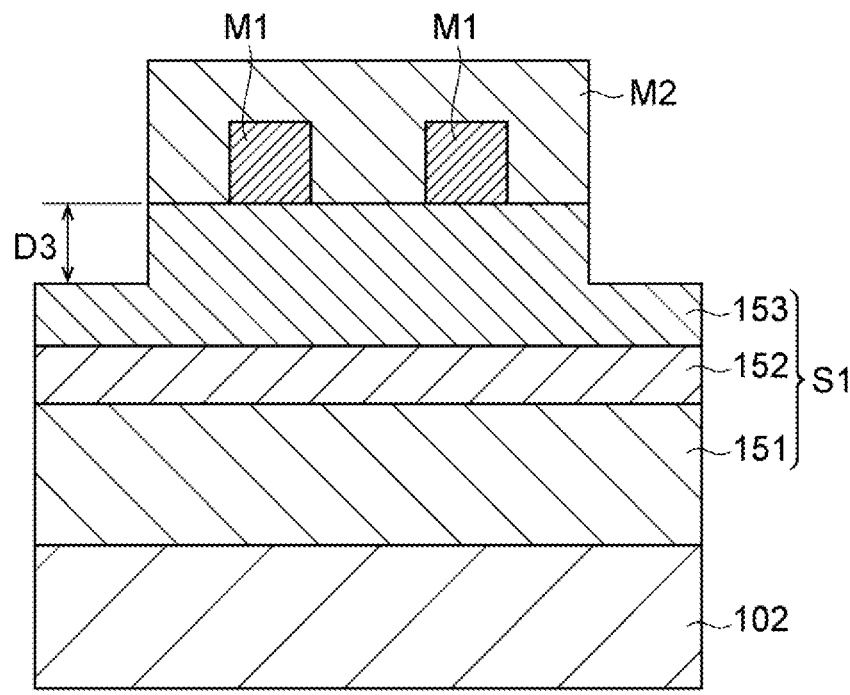
FIGS. 16A and 16B are cross-sectional views illustrating the optical directional coupler production method according to the second embodiment.

As shown in FIG. 16A, in the subsequent step ST13, portions of the stacked semiconductor layer S1 that are not covered with the mask M2 are dry-etched. In this step, the dry etching apparatus E shown in FIG. 7 is used. The depth D3 of etching is equal to a depth obtained by subtracting the height H2 of the ridges 107a and 107b from the height H1 of the mesa-shaped portion 108. Then the mask M2 is removed from the stacked semiconductor layer S1. In this case, an organic solvent such as acetone or N-methylpyrrolidone is used so that the mask M2 is selectively removed while the masks M1 remain present.

Figure 16B:
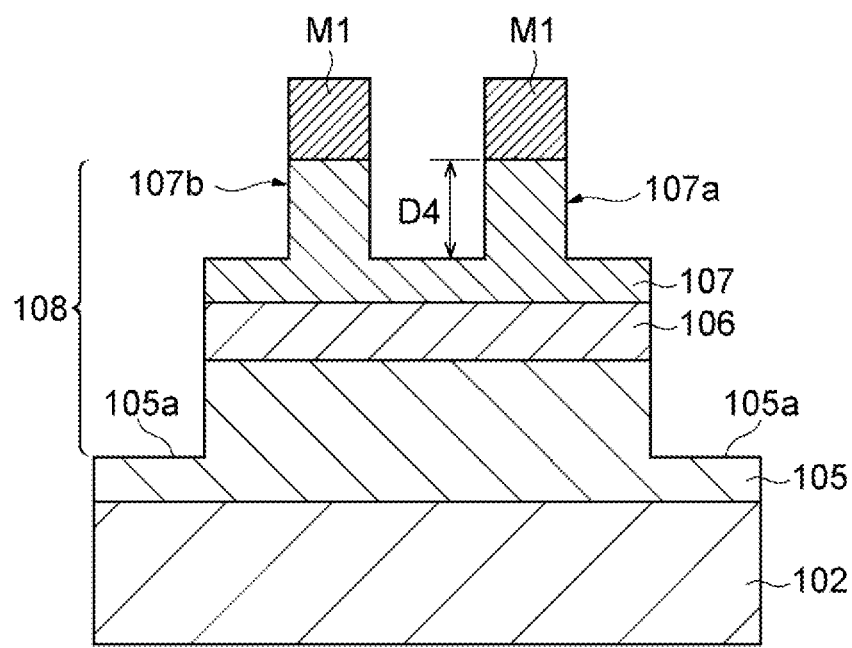

Next, as shown in FIG. 16B, portions of the stacked semiconductor layer S1 that are not covered with the masks M1 are dry-etched. Also in this step, the dry etching apparatus E shown in FIG. 7 is used. The depth D4 of etching is equal to the height H2 of the ridges 107a and 107b. The mesa-shaped portion 108 including the pair of ridges 107a and 107b is thereby formed. Then the masks M1 are removed from the stacked semiconductor layer S1 using hydrofluoric acid or buffered hydrofluoric acid. The optical directional coupler 1A in the present embodiment is thereby produced.

The details of step ST13 described above are as follows. In step ST13, the substrate product 200 is first introduced into the vacuum chamber 61 of the dry etching apparatus E shown in FIG. 7.

The etching gas is supplied to the vacuum chamber 61 so as to etch the stacked semiconductor layer S1. In the step ST15, ICP power is set to, for example, 100 W to 400 W. BIAS power is set to, for example, 100 W to 300 W. In the vacuum chamber 61, its vacuum state is maintained, for example, by a vacuum pump attached to the exhaust unit 71 (i.e., the vacuum chamber 61 is evacuated). The temperature of the substrate 102 may be maintained at 25° C. or lower using the cooling unit 69. The gases described above include water vapor.

The etching gas supplied to the dry etching apparatus E is a chlorine-based gas and is, for example, $BCl_3$ gas or a gas mixture of $BCl_3$ and $Cl_2$. In addition to the chlorine-based gas, an inert gas (such as Ar gas) is supplied to the vacuum chamber 61. The total flow rate of the gases supplied to the vacuum chamber 61 in the step ST13 is, for example, 50 sccm. When the chlorine-based gas is $BCl_3$ gas, the flow rate of the $BCl_3$ gas is set to, for example, 20 sccm, and the flow rate of the Ar gas is set to, for example, 30 sccm. When the chlorine-based gas is the above gas mixture, the flow rate of the $BCl_3$ gas is set to, for example, 15 sccm, the flow rate of the $Cl_2$ gas is set to, for example, 5 sccm, and the flow rate of the Ar gas is set to, for example, 30 sccm.

After the step ST13, the vacuum chamber 61 is evacuated while the partial pressure of hydrogen chloride in the vacuum chamber 61 is monitored (a step ST14). In the step ST14, the vacuum chamber 61 is evacuated until the mass spectrometer 72 indicates that the partial pressure of the hydrogen chloride in the vacuum chamber 61 has fallen within a predetermined range. For example, the vacuum chamber 61 is evacuated until the mass spectrometer 72 indicates that the partial pressure of the hydrogen chloride in the vacuum chamber 61 has fallen within the range of from $2 \times 10^{-5}$ Pa to $5 \times 10^{-5}$ Pa. In this manner, the hydrogen chloride generated in the step ST13 is discharged from the vacuum chamber 61. In order to reduce the change in the rate of etching of the stacked semiconductor layer S1 with hydrogen chloride, the vacuum chamber 61 is evacuated for more than 30 minutes. In addition, in order to improve the productivity for the optical directional coupler 1A, the vacuum chamber 61 is evacuated for less than 1 hour.

In the step ST14, to oxidize the chlorides in order to prevent the generation of hydrogen chloride, an oxygen plasma may be generated in the vacuum chamber 61. In the step ST14, to facilitate removal of water in the vacuum chamber 61, the interior of the vacuum chamber 61 may be heated. In this manner, water diffusing inside the vacuum chamber 61 is discharged, and the partial pressure of water in the vacuum chamber 61 may be reduced to, for example, $1 \times 10^{-6}$ Pa or less.

Next, after confirmation that the partial pressure of the hydrogen chloride has fallen within the predetermined range, a substrate product 200A (second substrate product, see FIG. 15A) different from the substrate product 200 is introduced into the vacuum chamber 61 while the vacuum state inside the vacuum chamber 61 is maintained (a step ST15). The substrate product 200A has the same structure as the substrate product 200 shown in the step ST12. In the previous process, the masks M1 and M2 are formed on the stacked semiconductor layer 51 of the substrate product 200A (see FIG. 15B). In the step ST15, the substrate product 200A is first introduced into a load lock chamber 73 connected to the vacuum chamber 61. When the load lock chamber 73 containing the substrate product 200A is evacuated within a predetermined pressure (vacuum), the gate 74 connecting the load lock chamber 73 to the vacuum chamber 61 is opened. Next, a robot arm (not shown), for example, is used to place the substrate product 200A on the lower electrode 66 of the vacuum chamber 61. Then the gate 74 is closed. In this manner, the optical directional coupler 1A is removed from the vacuum chamber 61, and the substrate product 200A is introduced into the vacuum chamber 61.

Next, the substrate product 200A introduced into the vacuum chamber 61 in the step ST15 is dry-etched with the chlorine-based gas in the vacuum chamber 61 (a step ST16). The step ST16 is the same process step as the step ST13. Therefore, in the step ST16, the substrate product 200A is dry-etched so as to form a mesa-shaped portion 108 including a ridge 107a and a ridge 107b. As described above, the substrate product 200A may be dry-etched with the partial pressure of the hydrogen chloride adjusted within the predetermined range in the vacuum chamber 61. After the step ST16, the step ST14 to the step ST16 may be repeated many times. In this case, a plurality of substrate products may be dry-etched with the partial pressure of the hydrogen chloride adjusted within the predetermined range in the vacuum chamber 61. In other words, by repeating the step ST14 to the step ST16, a plurality of substrate products may be dry-etched with the partial pressure of the hydrogen chloride adjusted within the predetermined range in the vacuum chamber 61.

The effects obtained by the above-described method of producing the optical directional coupler 1A according to the present embodiment will be described. The coupling coefficient between the optical waveguide portions 103a and 104a is one of the principal characteristics of the optical directional coupler 1A. The coupling coefficient is determined by the distance between the ridges 107a and 107b and the height of the ridges 107a and 107b. If the distance between the ridges 107a and 107b or the height of the ridges 107a and 107b differs for different optical directional couplers, variations in their characteristics may result. The variations in the distance between the ridges 107a and 107b can be easily reduced when the etching masks have high positional accuracy. However, to reduce the variations in the height of the ridges 107a and 107b, it is necessary to control the depth of etching precisely. In an ordinary semiconductor process, an etch stop layer having a lower etching rate than a semiconductor layer to be etched is provided in order to control the etch depth precisely. However, when such an etch stop layer is provided on the lower cladding layer 105, the refractive index distribution in the depth direction of the optical waveguides 103 and 104 changes, and optical loss increases. It is therefore necessary to control the etch depth precisely by controlling the time of etching without using the etch stop layer. In the optical directional coupler 1A, allowable variations in equivalent refractive indexes of the optical waveguide portions 103a and 104a are ±5% or less. It is therefore necessary to reduce the variations in the etch depth to ±1% or less.

In the embodiment, in the step ST13, the stacked semiconductor layer S1 of the substrate product 200 is dry-etched with the chlorine-based gas in the vacuum chamber 61. Therefore, the chlorine-based gas reacts with elements contained in the stacked semiconductor layer S1, and chlorides are thereby formed. When the mask M2 includes a resin such as a resist, the mask M2 includes water. When the chlorides react with water in the vacuum chamber 61, hydrogen chloride serving as an etching gas is generated. In the above-described production method, the partial pressure of hydrogen chloride in the vacuum chamber 61 is monitored. After confirmation that the partial pressure of hydrogen chloride has fallen within the predetermined range, another substrate product 200A is introduced into the vacuum chamber 61 while the vacuum state in the vacuum chamber 61 is maintained. Then the substrate product 200A is dry-etched. In this case, the substrate product 200A may be dry-etched after the partial pressure of hydrogen chloride has been set within the predetermined range, so that the change in the etching rate due to the hydrogen chloride may be preferably reduced. Therefore, even though the maintenance such as exposure of the vacuum chamber to the atmosphere and wiping with a damp cloth is not performed frequently, the etching rate of the stacked semiconductor layer S1 is unlikely to change. As a result, the variations in the etch depth may be reduced to ±1% or less. For example, the etch depth may be adjusted with high precision of 1nm in the step ST16. Therefore, the variations in the optical characteristics of the optical directional coupler 1A are effectively reduced. In addition, by performing the above-described production method, the frequency of the maintenance may be reduced, and the efficiency of production of the optical directional coupler 1A may be improved.

In the step ST14 in the embodiment, the vacuum chamber 61 is evacuated until the mass spectrometer 72 indicates that the partial pressure of the hydrogen chloride in the vacuum chamber 61 has fallen within the range of from $2\times10^{-5}$ Pa to $5\times10^{-5}$ Pa. In this case, the change in the rate of etching of the stacked semiconductor layer S1 with hydrogen chloride may be reduced.

In the step ST14 in the embodiment, the oxygen plasma may be generated in the vacuum chamber 61. In this case, the chlorides are oxidized. Therefore, hydrogen chloride, which is a reaction product of water and a chloride, is less likely to be generated. In addition, chlorine is more easily discharged from the vacuum chamber 61 than hydrogen chloride. Therefore, the execution time of the step ST14 may be reduced.

In the step ST14 in the embodiment, the interior of the vacuum chamber 61 may be heated. In this case, water in the vacuum chamber 61 is easily removed. Therefore, hydrogen chloride, which is a reaction product of water and a chloride, is less likely to be generated.

In the embodiment, the mask M1 having at least one of hydrophobicity and water impermeability may be formed on the stacked semiconductor layer S1. In this case, water is unlikely to adhere to the mask formed on the stacked semiconductor layer S1. Therefore, the amount of water diffusing inside the vacuum chamber due to the mask may be reduced. Moreover, the partial pressure of water in the vacuum chamber 61 in the step ST14 may be set to, for example, $1\times10^{-6}$ Pa or less.

In the step ST14 in the embodiment, the mass spectrometer 72 may be used to check the partial pressure of hydrogen chloride. In this case, whether or not the partial pressure of hydrogen chloride has fallen within the predetermined range may be accurately checked.

The methods for producing a semiconductor laser device and an optical directional coupler according to the present invention are not limited to the above embodiment, and various modifications are possible. For example, the contents of Al in the layers in the above embodiment are merely examples and are not limitations. To prevent water from entering the vacuum chamber 61 from the outside, a heat-resistant metal gasket may be used for a part of the vacuum chamber 61.

In the above embodiment, the substrate 2 with the semiconductor mesas M formed thereon is removed from the vacuum chamber 61 in the fourth process step ST4, and then the substrate product 100A is introduced into the vacuum chamber 61, but this is not a limitation. For example, the substrate 2 with the semiconductor mesas M formed thereon may be removed from the vacuum chamber 61 in the third process step ST3 or may be removed immediately after the second process step ST2. Specifically, the removal of the substrate 2 from the vacuum chamber 61 and the introduction of the substrate product 100A into the vacuum chamber 61 may not be performed in the same process step.

While the principle of the present invention has been illustrated and described in the preferred embodiments, it will be appreciated by those skilled in the art that changes can be made to the arrangement and details of the present invention without departing from the principle. The present invention is not limited to the specific configuration disclosed in the embodiments. Therefore, the applicant claims all modifications and changes falling within the claims and the scope of spirit thereof.

What is claimed is:

1. A method of producing a semiconductor laser device, the method comprising:
    a step of preparing first and second substrate products each of which includes a substrate having a principal surface and a stacked semiconductor layer formed on the principal surface of the substrate, the first and second substrate products being different from each other, the stacked semiconductor layer including a contact layer, an n-type semiconductor layer formed on the contact layer, an active layer formed on the n-type semiconductor layer, and a p-type semiconductor layer formed on the active layer;
    a first step of introducing the first substrate product into a vacuum chamber and etching the first substrate product with a chlorine-based gas in the vacuum chamber by a dry etching method;
    a second step of evacuating the vacuum chamber while monitoring a pressure of hydrogen chloride in the vacuum chamber so as to obtain a partial pressure of the hydrogen chloride within a predetermined range;
    a third step of introducing the second substrate product into the vacuum chamber while maintaining a vacuum state inside the vacuum chamber; and
    a fourth step of introducing the second substrate product into the vacuum chamber and etching the second substrate product with a chlorine-based gas in the vacuum chamber by the dry etching method.

2. The method of producing a semiconductor laser device according to claim 1,
    wherein, in the first step, the first substrate product is etched until the contact layer is exposed so as to form a semiconductor mesa on the substrate.

3. The method of producing a semiconductor laser device according to claim 1,
    wherein the range is between $2\times10^{-5}$ Pa and $5\times10^{-5}$ Pa.

4. The method of producing a semiconductor laser device according to claim 1,
    wherein the second step includes a step of generating an oxygen plasma in the vacuum chamber.

5. The method of producing a semiconductor laser device according to claim 1, wherein the second step includes a step of heating an interior of the vacuum chamber.

6. The method of producing a semiconductor laser device according to claim 1, wherein in the first step, the first substrate product is etched through a mask formed on the stacked semiconductor layer of the first substrate product, and in the fourth step, the second substrate product is etched through a mask formed on the stacked semiconductor layer of the second substrate product, and each of the masks at the first step and the fourth step has at least one of hydrophobicity and water impermeability.

7. The method of producing a semiconductor laser device according to claim 1, wherein, in the second step, the partial pressure of the hydrogen chloride in the vacuum chamber is monitored by using a mass spectrometer.

\* \* \* \* \*